(12) United States Patent
Schneider et al.

(10) Patent No.: US 8,120,515 B2
(45) Date of Patent: Feb. 21, 2012

(54) KNOWLEDGE BASED ENCODING OF DATA WITH MULTIPLEXING TO FACILITATE COMPRESSION

(75) Inventors: John C. Schneider, Bellevue, WA (US); Richard A. Rollman, Sammamish, WA (US); Milen M. Nankov, Sammamish, WA (US); Ethan Hugg, Seattle, WA (US)

(73) Assignee: AgileDelta, Inc., Bellevue, WA (US)

( * ) Notice: Subject to any disclaimer, the term of this patent is extended or adjusted under 35 U.S.C. 154(b) by 926 days.

(21) Appl. No.: 11/861,988

(22) Filed: Sep. 26, 2007

(65) Prior Publication Data

US 2008/0082556 A1    Apr. 3, 2008

Related U.S. Application Data

(60) Provisional application No. 60/848,111, filed on Sep. 29, 2006.

(51) Int. Cl.
 *H03M 7/34* (2006.01)
 *H03M 7/38* (2006.01)
(52) U.S. Cl. .......................................... 341/51; 341/50
(58) Field of Classification Search .................. 341/50, 341/51, 65, 67, 106, 63, 58, 59
See application file for complete search history.

(56) References Cited

U.S. PATENT DOCUMENTS

| | | | |
|---|---|---|---|
| 6,282,212 B1 * | 8/2001 | Kitazawa | 370/537 |
| 6,577,254 B2 * | 6/2003 | Rasmussen | 341/51 |
| 6,624,761 B2 * | 9/2003 | Fallon | 341/51 |
| 7,075,460 B2 | 7/2006 | Apostolopoulos et al. | |
| 7,209,714 B2 * | 4/2007 | Ross et al. | 455/101 |
| 7,408,486 B2 * | 8/2008 | Kilbank | 341/107 |
| 7,573,407 B2 * | 8/2009 | Reznik | 341/67 |
| 7,663,513 B2 * | 2/2010 | Pang et al. | 341/67 |
| 2003/0231714 A1 | 12/2003 | Kjeldsen et al. | |
| 2005/0204109 A1 | 9/2005 | Apostolopoulos et al. | |
| 2006/0188128 A1 | 8/2006 | Rhoads | |
| 2010/0023470 A1 * | 1/2010 | Schneider et al. | 706/47 |

FOREIGN PATENT DOCUMENTS

WO   WO01/11492 A1   2/2001

OTHER PUBLICATIONS

International Search Report for PCT/US07/79756, mailed May 7, 2008, 2 pages.
Written Opinion for PCT/US07/79756, mailed May 7, 2008, 6 pages.

* cited by examiner

*Primary Examiner* — Peguy Jean Pierre
(74) *Attorney, Agent, or Firm* — Schwabe, Williamson & Wyatt, P.C.

(57) ABSTRACT

Methods, apparatuses, and articles of manufacture for encoding data and decoding encoded data based on one or more knowledge representation describing the data, which may include one or more finite automata; for multiplexing the encoded data, after encoding the data; and for de-multiplexing the encoded data, before decoding the encoded data, are described herein.

25 Claims, 14 Drawing Sheets

```
Knowledge of Data (XML Schema Fragment)                              502a

<xs:element name="note">
  <xs:complexType>
    <xs:sequence>
        <xs:element name="to" type="xs:string"/>
        <xs:element name="from" type="xs:string"/>
        <xs:element name="heading" type="xs:string"/>
        <xs:element name="body" type="xs:string"/>
    </xs:sequence>
  </xs:complexType>
</xs:element>
```

Knowledge of Data (XML Schema Fragment)  506c

```
<xs:group name="ownergroup">
  <xs:sequence>
    <xs:element name="ownerName" type="xs:string"/>
    <xs:element name="ownerAddress" type="xs:string"/>
  </xs:sequence>
</xs:group>
<xs:group name="petgroup">
  <xs:sequence>
    <xs:element name="petName" type="xs:string"/>
    <xs:element name="petColor" type="xs:string"/>
  </xs:sequence>
</xs:group>
<xs:group name="adopternamegroup">
  <xs:sequence>
    <xs:element name="isAdopted" type="xs:boolean"/>
    <xs:element name="shots" type="xs:boolean"/>
  </xs:sequence>
</xs:group>
<xs:element name="pet">
  <xs:complexType>
    <xs:choice>
      <xs:group ref="ownergroup"/>
      <xs:group ref="petgroup"/>
      <xs:element name="adopted">
        <xs:complexType>
          <xs:choice>
            <xs:group ref="adopternamegroup"/>
            <xs:element name="isNotAdopted" type="xs:boolean"/>
          </xs:choice>
        </xs:complexType>
      </xs:element>
    </xs:choice>
  </xs:complexType>
</xs:element>
```

FIG. 5c

```
Knowledge of Data (XML Schema Fragment)                              602a
<xs:element name="note">
  <xs:complexType>
   <xs:sequence>
        <xs:element name="to" type="xs:string"/>
        <xs:element name="from" type="xs:string"/>
        <xs:element name="heading" type="xs:string"/>
        <xs:element name="body" type="xs:string"/>
   </xs:sequence>
  </xs:complexType>
</xs:element>
```

FIG. 6a

```
Data (XML Fragment Deviating from Schema)                            604b
<note>
<to>Tove</to>
<from>Jani</from>
<heading>Reminder</heading>
<date>October 17</date>
<body>Don't forget me this weekend!</body>
</note>
```

FIG. 6b

Representation of Knowledge Including Deviations (Finite Automaton)    606c

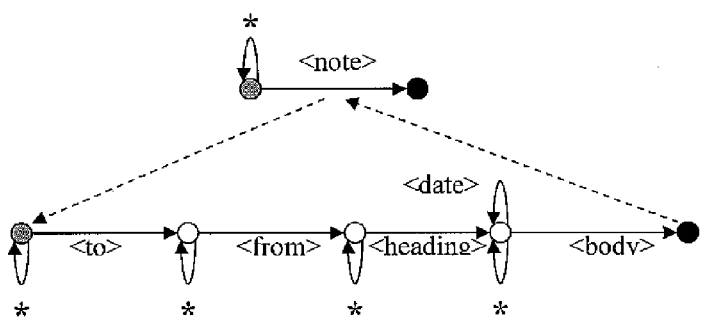

FIG. 6c

KNOWLEDGE BASED ENCODING OF DATA WITH MULTIPLEXING TO FACILITATE COMPRESSION

RELATED APPLICATIONS

The present application claims priority to U.S. Provisional Application 60/848,111, entitled "Knowledge Based Encoding of Data with Multiplexing to Facilitate Compression", filed on Sep. 29, 2006. The specifications of the 60/848,111 provisional application is hereby fully incorporated by reference.

STATEMENT REGARDING GOVERNMENT SPONSORED RESEARCH OR DEVELOPMENT

This invention was made with government support under contract FA8750-06-C-0038 awarded by The Air Force Research Lab. The government has certain rights in the invention.

TECHNICAL FIELD

Embodiments of the present invention relate to the field of data processing, in particular, to encoding and decoding data based at least in part on knowledge of the data, and to multiplexing/de-multiplexing, combining/separating and compressing/decompressing the encoded data.

BACKGROUND

Various encoding and decoding techniques have been developed and employed to facilitate efficient storage and/or transfer of data, e.g. media data, such as video and/or audio data.

Increasingly, the Extensible Markup Language (XML) has become the standard for sharing data over networks such as the Internet. With advances in networking, processor speed, memory, and client server/architecture enabling increased information sharing, the need for a language representing data in a platform independent manner became increasingly clear. Though capable of connecting to each other over the Internet and other networks, many computing devices struggled to share data due to their differing platforms. XML answered this need by separating data from programming and display language specific requirements, and facilitating the representation of the data itself and its structure, utilizing "elements" that described the data in a nested fashion (see FIG. 6b for an example of XML).

XML has become so prevalent that numerous other languages and standards based on XML have been developed. These languages and standards include XSL (the Extensible Stylesheet Language), which describes how an XML document is to be displayed; XSLT (Extensible Stylesheet Language Transformations), which transforms XML documents into other XML documents or into XHTML documents (Extensible Hypertext Markup Language); XPath, which is a language for finding information in an XML document; XQuery, which facilitates the querying of XML documents; DTD (Document Type Definition), which defines the legal building blocks (elements) of an XML document; and XML Schema Language, which serves as an XML-based alternative to DTDs, declaring elements that may occur in an XML document and the order of their occurrence. Numerous application interfaces, such as the XML DOM (Document Object Model), have also arisen, facilitating the accessing and manipulating of XML documents.

Given the increasing processor speeds of personal computers and workstations and the increasing use of fast, efficient broadband network connections, the large size of XML documents has not always been seen as a problem. However, from XML's inception, it has been recognized that its very large size (relative to its content) would be problematic for computer systems and enterprises that have high efficiency needs. With the revolution in small, mobile device technology, the problems of XML efficiency have become more acute. Mobile devices are limited by their size to smaller storage, memory, and bandwidth. An XML document that might not overwhelm a PC on a broadband connection might pose serious problems for a cell phone or PDA. For these devices, large XML files take too long to download, require too much memory and require lengthy processing times, draining the device's battery. In addition, providers of network connectivity for some of these devices bill for the amount of data transferred rather than the amount of time connected, leading to increasingly large bills for mobile devices. Thus, the large size and situational inefficiency of XML are becoming problematic.

In response, a number of application-specific and proprietary tools for reducing the size of XML have been developed. Such tools include ASN-1, WAP WB-XML, Millau, and compression tools such as Win-Zip. None of these tools, however, provides an efficient version of XML that works well for the full range of XML, including small documents, large documents, strongly typed data and loosely typed documents. In addition, none of them support the extensibility and flexibility required by XML applications and none of them scale well for a wide range of small, mobile devices and large, high-processing power devices.

BRIEF DESCRIPTION OF THE DRAWINGS

Embodiments of the present invention will be described by way of exemplary embodiments, but not limitations, illustrated in the accompanying drawings in which like references denote similar elements, and in which:

FIGS. 5a-5d illustrate exemplary schemas providing knowledge of the received data, and finite automata representing those schemas, in accordance with various embodiments of the invention;

FIGS. 6a-6c illustrate an exemplary schema providing knowledge of the received data, received XML data having deviations from the schema, and a finite automaton representing both the schema and deviations from the schema, in accordance with various embodiments of the invention;

DETAILED DESCRIPTION OF ILLUSTRATIVE EMBODIMENTS

Illustrative embodiments of the present invention include but are not limited to methods and apparatuses for encoding data and decoding encoded data based on one or more knowledge representation describing the data, which may include one or more finite automata; for multiplexing the encoded data, after encoding the data; and for de-multiplexing the encoded data, before decoding the encoded data.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
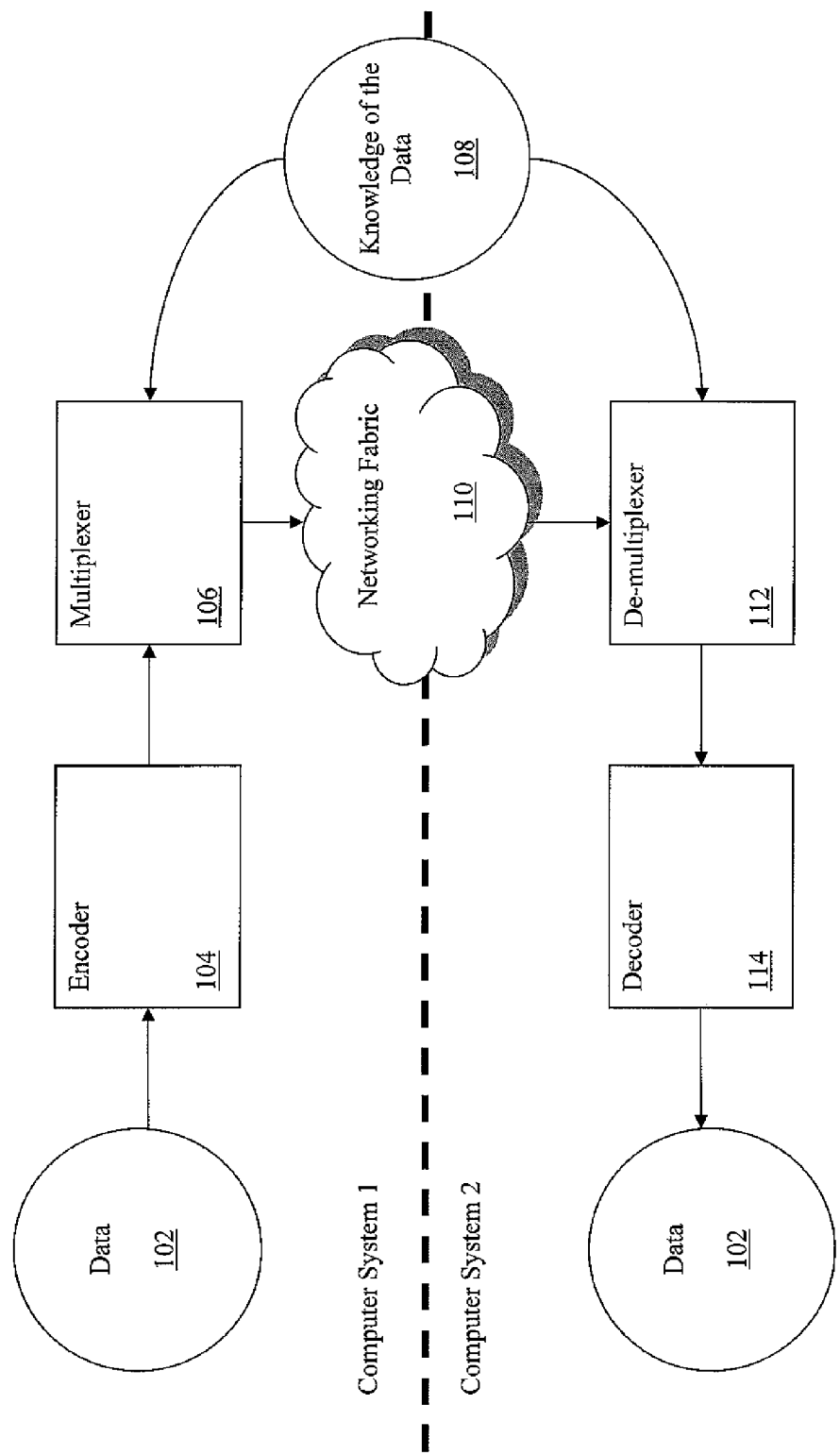
FIG. 1 illustrates an overview of the invention, in accordance with various embodiments.

FIG. 1 illustrates an overview of the present invention, in accordance with various embodiments. As illustrated, a first computer system may include data 102, encoder 104, multiplexer 106, and knowledge of the data 108, and a second computer system may include data 102, decoder 114, de-multiplexer 112, and knowledge of the data 108. The two computer systems may be connected by a networking fabric 110, in some embodiments, and may share the knowledge of the data 108, and the various elements in each computer system may be operatively coupled to each other as shown. Encoder 104, incorporated with the teachings of the present invention, may receive data 102. Data 102 may be received from one or more application or system processes, via an application interface (API). Encoder 104, as will be described in more detail below, encodes data based at least in part on one or more knowledge representations of the data, compiled from knowledge of the data 108. In various embodiments, the knowledge representations of the received data may comprise one or more finite automata (deterministic or non-deterministic). Encoder 104 may determine and generate a stream of encoding values, as a stream of bytes, for the received data based on the knowledge representations. Upon generating the stream of encoding values, encoder 104 may provide the stream of encoding values to a multiplexer 106 adapted to split the stream into a plurality of substreams of encoding values, as a plurality of substreams of bytes, to facilitate compression. The plurality of substreams may either be sent by the first computer system to a second computer system via a networking fabric 110, or may, in other embodiments not shown here, be written by the first computer system onto one or more storage media for transfer to a second computer system having a decoder 114 and a de-multiplexer 112. Upon receipt of the plurality of substreams of encoding values, the de-multiplexer 112 of the second computer system may combine the substreams into a stream of encoding values. The decoder 114, incorporated with the teachings of the present invention, may then recover the data 102 corresponding to the encoding values and re-generate the data 102 accordingly. The recovery of the data 102 may be based at least in part on the knowledge representation representing knowledge of the data 108, which may include one or more finite automata. Upon recovering the data 102, one or more application or system processes may access the data 102 from decoder 114, in some embodiments via an API.

In various embodiments, knowledge of the data 108 may be compiled on a separate computer system from the encoder 106 and decoder 112. In some embodiments, not shown, one computer system may have all of encoder 104, multiplexer 106, de-multiplexer 112 and decoder 114 for encoding and multiplexing transmit data and for de-multiplexing and decoding receive data, respectively. Further, the computer system or systems having one or more of the above processes and data may be of any type known in the art, including, but not limited to, PCs, workstations, servers, routers, mainframes, PDAs, set-top boxes, and mobile phones. In various embodiments, some or all of the computer systems embodied with encoder 104, multiplexer 106, de-multiplexer 112, and/or decoder 114 may be coupled with each other by one or more networks, such as networking fabric 110, and the networks may be of any type known in the art, such as a local area network (LAN) or a wide area network (WAN), private or public, e.g. the Internet. In various embodiments, some or all of the computer systems may not be networked, and may require users of the computer systems to facilitate transfer of the encoded data and/or knowledge representations of the data between the computer systems, e.g. via removable storage media.

In embodiments of the invention where multiple computer systems are involved, such as the embodiments illustrated by FIG. 1, content negotiation may also be practiced. For example, if the second computer system in FIG. 1 requests data 102 from the first computer system using the hypertext transfer protocol (HTTP), the second computer system may utilize e.g. the "accept" field of the HTTP header of the initial request to inform the first computer system of a content type or types it supports (such as XML) and of an encoding type it supports (such as the knowledge-based encoding practiced by encoder 104 and decoder 114). The first computer system, in response to the request, may then inform the second computer system of the content-type and encoding-type it will use to transmit the data 102. By negotiating content in such a fashion, in advance of any encoding operations, embodiments of the present invention allow a computer system having one or more of the encoder 104 and decoder 114 to communicate with computer systems that likewise have one or more of the encoder 104 and decoder 114, and computer systems that do not have the encoder 104/decoder 114. Thus, only where the above communications result in informing the computer systems that the data provider has the encoder 104 and the data recipient has the decoder 114 may the data be encoded and decoded in the manner described below.

In one embodiment, where the second computer system in the above example is a server offering web services, and the first computer system is a client, the first communication from the client to the server may be an HTTP "get" message. The server may then reply to the client with a "204" message informing the client of content and encoding types understood by the server (such as XML and the encoding practiced encoder 104 and decoder 114). The client may then cache the server reply, and when later transferring data 102 to the server using an HTTP "put," the client may use its encoder 104 to encode the data it transfers to the server, and the server receiving the data 102 may know how to decode/process it.

In some embodiments, the above described content negotiation may even include knowledge negotiation. That is, in addition to informing each other of the content and encoding types they support, first and second computer systems may inform each other of their respective knowledge of the data 108 (such as schemas, if the data is XML). In one embodiment, illustrated by FIG. 1, both computer systems may have exactly the same knowledge. In other embodiments, however, one computer system may have more knowledge than another. For example, first computer system may have schemas 'A' through 'M', and second computer system may have schemas 'A' through 'K'. In such embodiments, shared knowledge 108 comprises only schemas 'A' through 'K'. Thus, in subsequently encoding the data 102, the first computer system having encoder 104 may ignore schemas 'L' through 'M', since both the encoder 104 and decoder 114 must use the same knowledge 108 in encoding and decoding, as that decoder 114 performs the same process in reverse of the encoder 104. For the data 102 described by schemas 'L' through 'M', the extensibility feature of encoder 104/decoder 114 described below may be practiced. In yet another embodiment, one or more of the computer systems may be connected to a knowledge repository containing, for example, schema 'L' through 'M'. In such embodiments, the second computing device may retrieve these schemas that it does not possess, increasing the shared knowledge 108 to include schemas 'A' through 'M'.

Application or system processes generating and receiving data 102 may be any sort of executing application(s) and/or system service(s) known in the art capable of generating and consuming data. Data 102 generated and consumed by application or system processes may include one or more of XML data, raw, unstructured data, character data, and/or data organized into structures, such as those defined by a programming language (e.g., the C Language) or an interface definition language (IDL) (e.g., CORBA IDL). The data 102, however, need not be one of the above, but may be any sort of data 102 known in the art (i.e., any combination of zero, one, or more bits). In some embodiments, the application or system processes may provide the data to or receive data from an API using one or more of tree structures, streams of data items, streams of bytes, and structures defined by a programming language or IDL. Additionally, the data 102 may be provided or received as one or more of the data types integer, long, short, byte, string, date, Boolean, float, double, qualified name, byte array, and typed list.

APIs may be implemented as separate processes, or in alternate embodiments, may form an executing layer of the encoder 104 and decoder 114. In various embodiments, the APIs may conform to one or more of the XML Document Object Model (DOM), Simple API for XML (SAX), Streaming API for XML (StAX), and Java API for XML Binding (JAXB).

Figure 2:
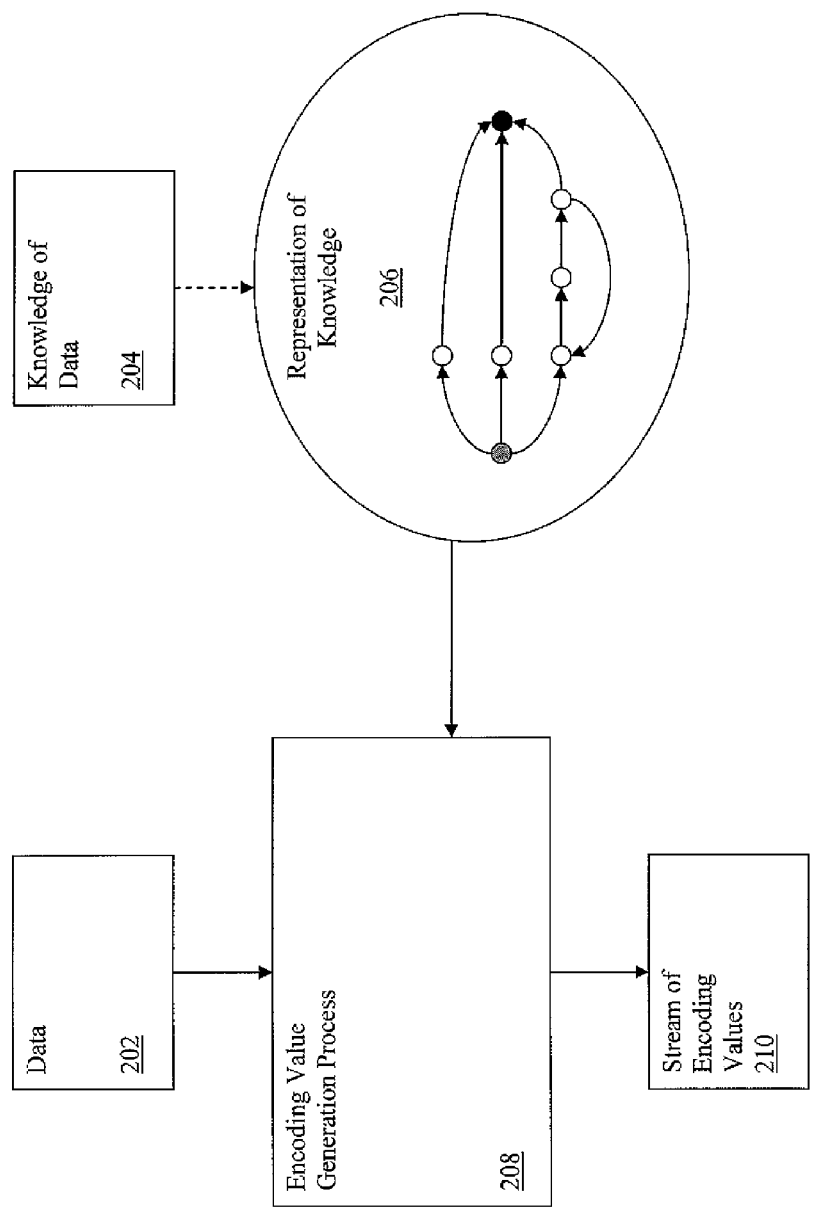
FIG. 2 illustrates in further detail selected aspects of an encoder of the invention, in accordance with various embodiments.
Figure 4:
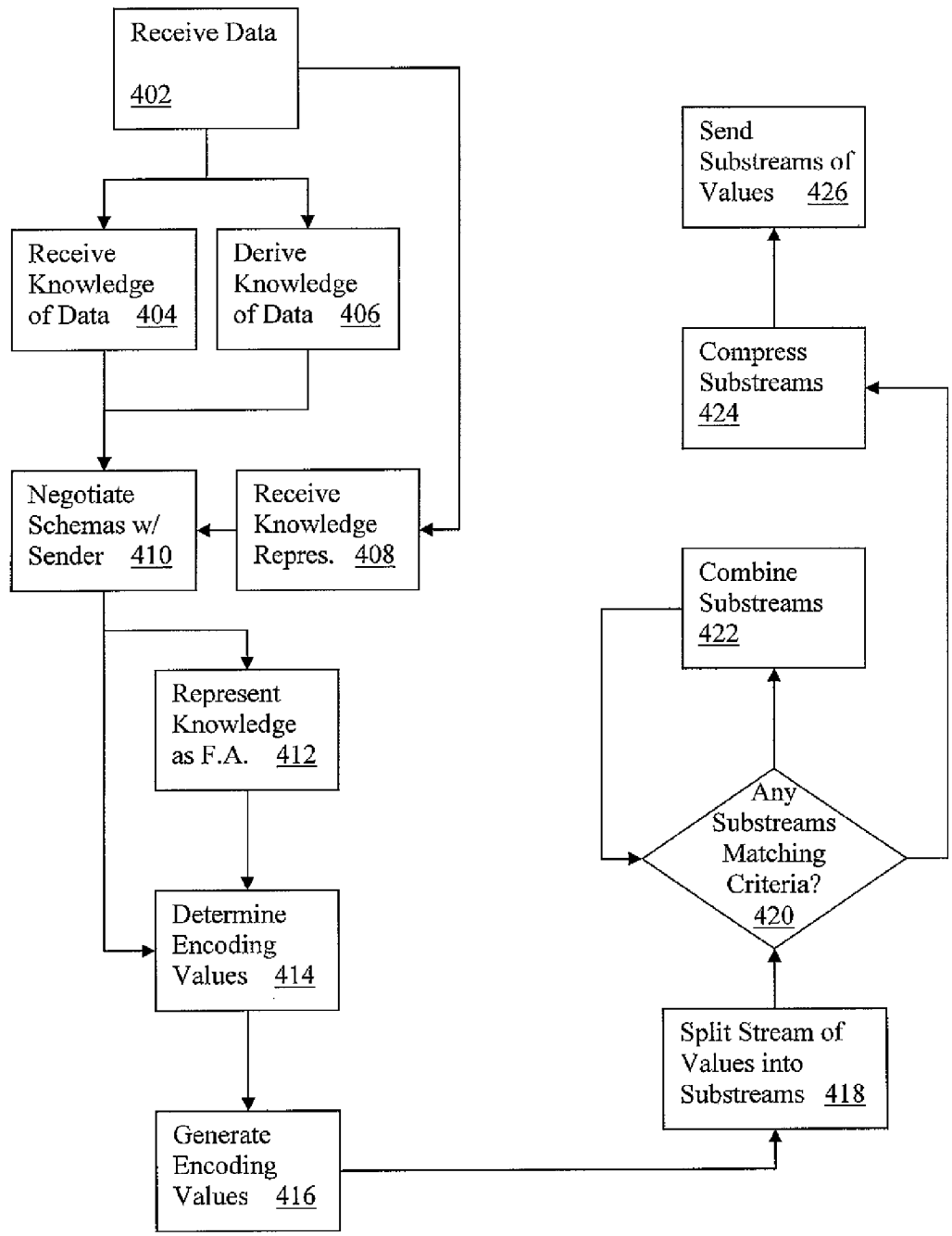
FIG. 4 illustrates a flow chart view of selected operations needed to represent received data as encoding values, facilitated by one or more finite automata, and to split the encoding values into a plurality of substreams, in accordance with various embodiments.
Figure 10:
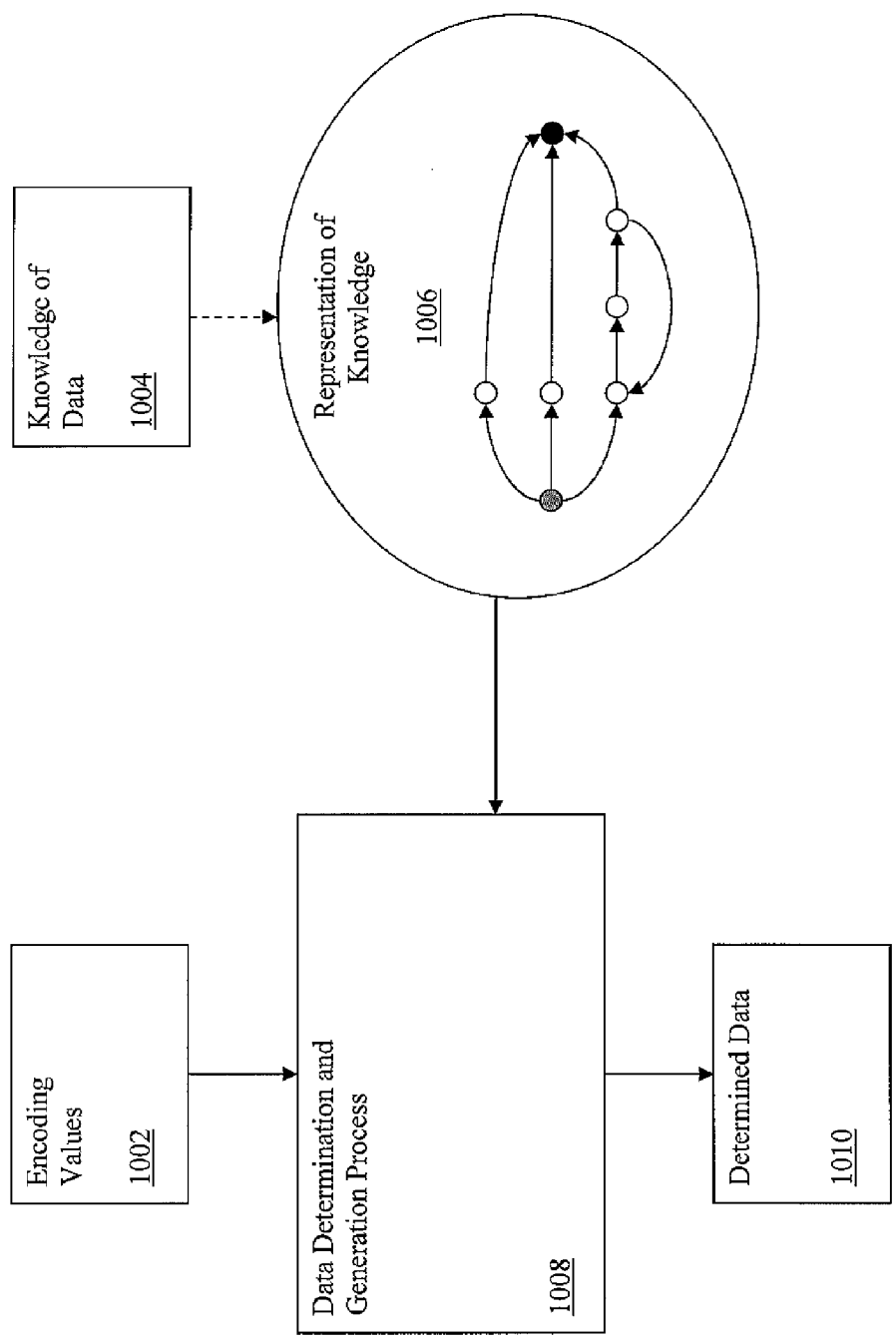
FIG. 10 illustrates in further detail selected aspects of a de-multiplexer of the invention, in accordance with various embodiments.
Figure 11:
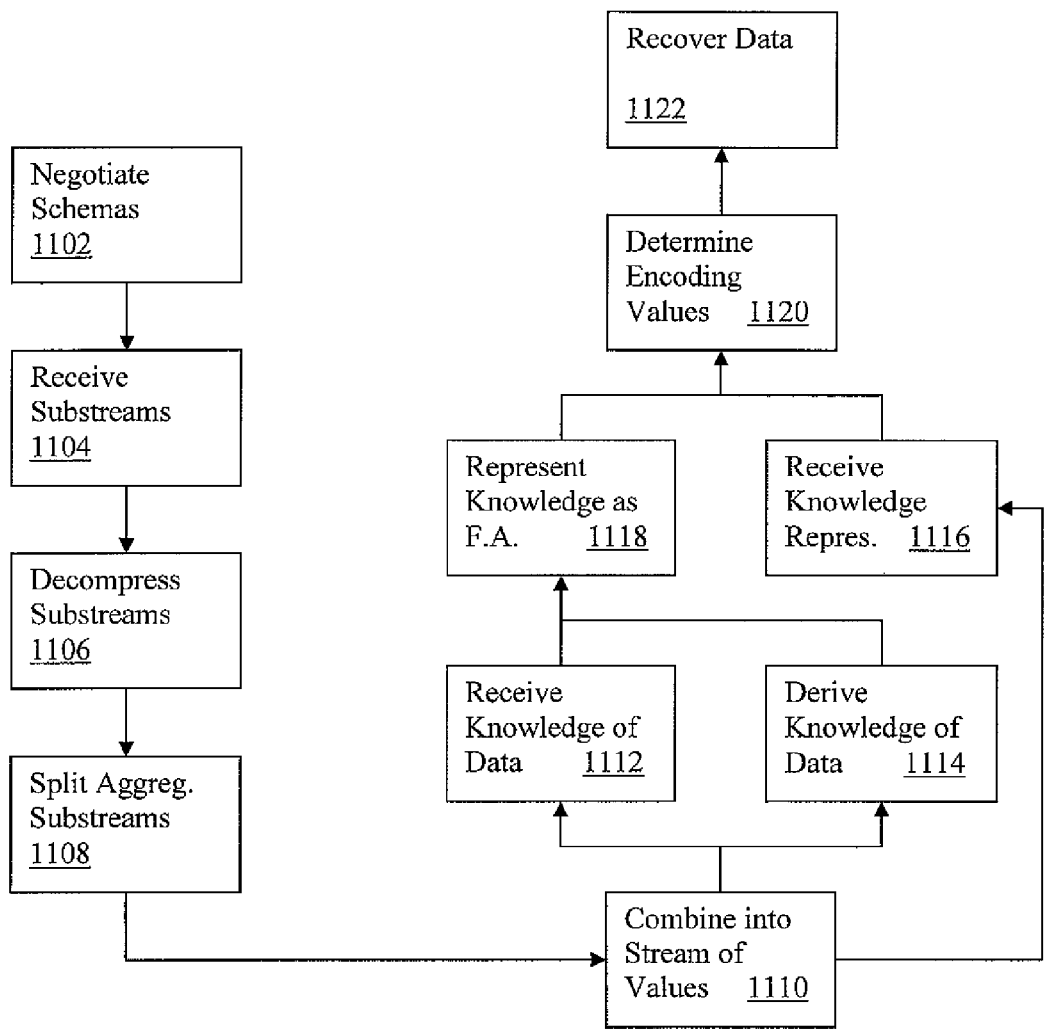
FIG. 11 illustrates a flow chart view of selected operations needed to combine a received plurality of substreams of encoding values, and to determine data corresponding to encoding values, facilitated by one or more finite automata, in accordance with various embodiments.

Encoder 104 and decoder 114 may be implemented as one or more processes of a computer system capable or receiving data 102 (if encoder 104) or values representing data 102 (if decoder 114), receiving or deriving a knowledge representation describing the data 102, which may include one or more finite automata, determining either values to represent the data 102 (if encoder 104) or data 102 represented by the values (if decoder 114), based at least in part on the knowledge representation of the data, such as one or more finite automata, and generating either the encoding values as a stream of bytes (if encoder 104) or the data 102 (decoder 114). Details of selected aspects of these operations as performed by the encoder 104 are depicted in FIGS. 2 and 4, and discussed further below. Details of selected aspects of these operations as performed by decoder 114 are depicted in FIGS. 10 and 11 and discussed further below.

Figure 3:
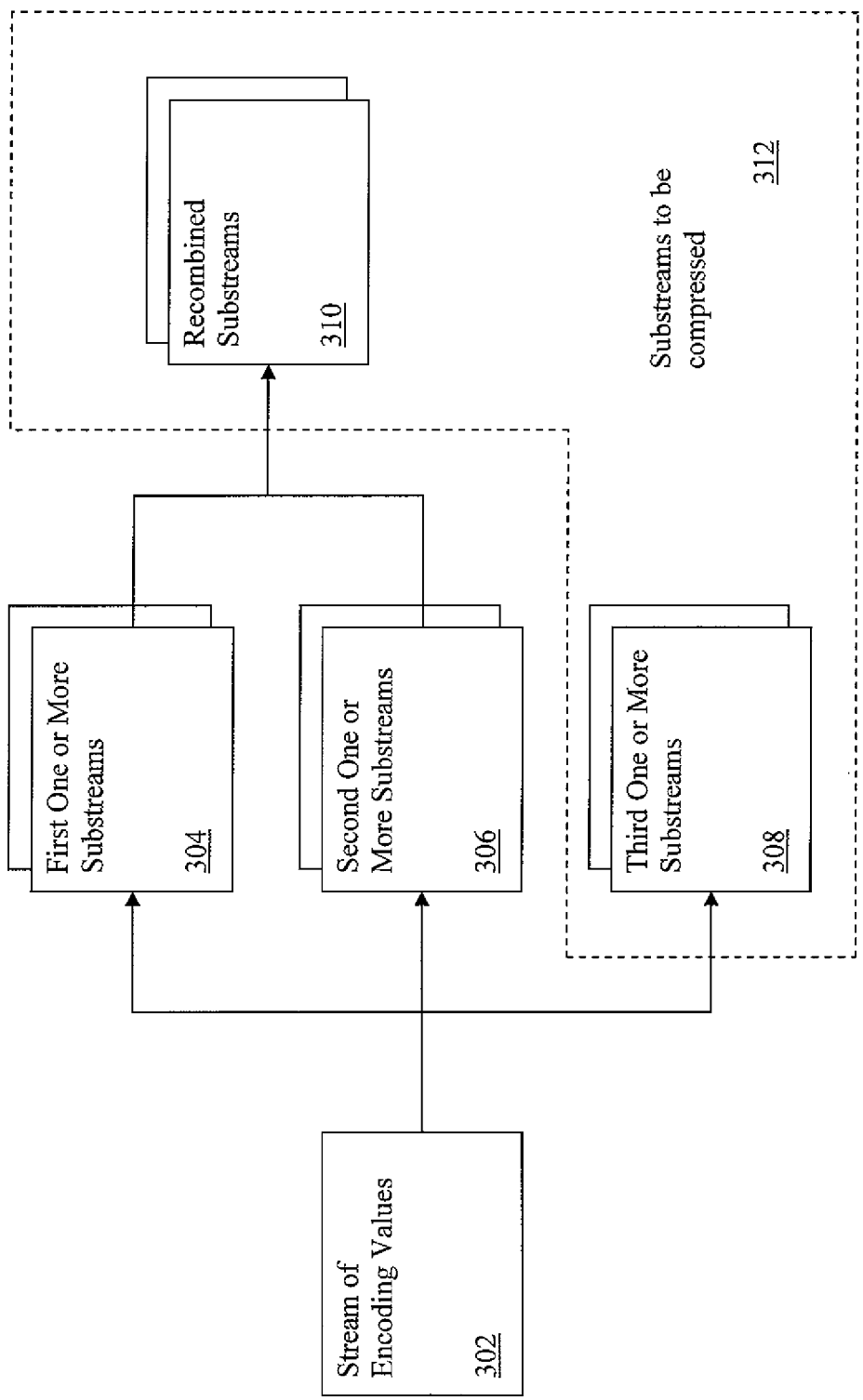
FIG. 3 illustrates in further detail selected aspects of a multiplexer of the invention, in accordance with various embodiments.
Figure 9:
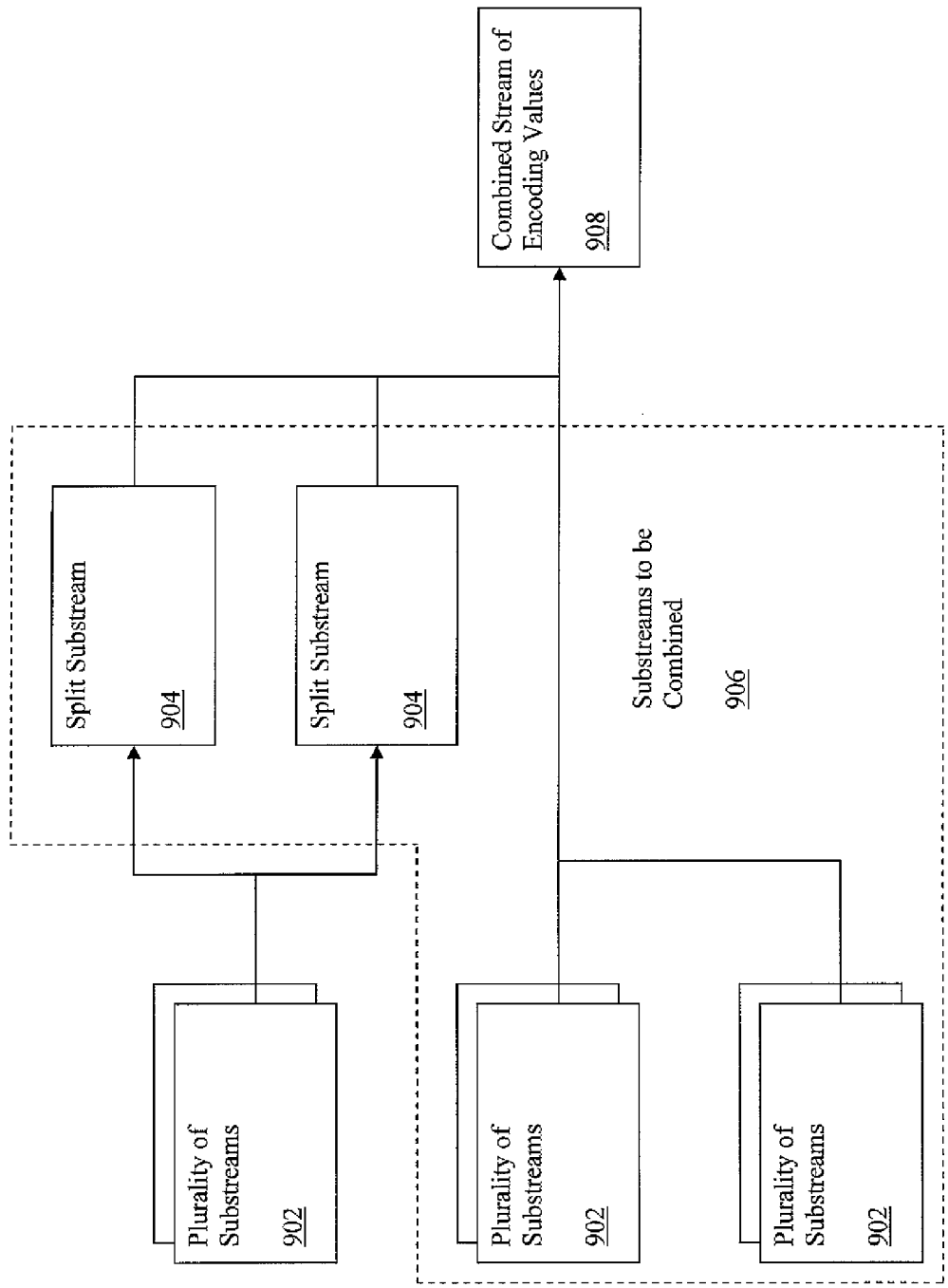
FIG. 9 illustrates in further detail selected aspects of a decoder of the invention, in accordance with various embodiments.

Multiplexer 106 and de-multiplexer 112 may be implemented as one or more processes (or hardware components) of a computer system. Multiplexer 106 may be capable of splitting a stream of bytes of encoding values into a plurality of substreams of bytes of encoding values, based on first one or more criteria, re-combining a portion of the plurality of substreams, based on second one or more criteria, and compressing the plurality of substreams. De-multiplexer 112 may be capable of decompressing the plurality of substreams, splitting substreams that have been recombined by multiplexer 106, and combining the plurality of substreams into a stream of encoding values. Details of selected aspects of these operations as performed by the multiplexer 106 are depicted in FIGS. 3 and 4, and discussed further below. Details of selected aspects of these operations as performed by de-multiplexer 112 are depicted in FIGS. 9 and 11 and discussed further below.

As is further illustrated, knowledge of the data 108 is shared knowledge—that is—knowledge available to both the first and second computer systems. The knowledge of the data 108 may be provided in advance to one or both of the computer systems, may be acquired from one or more separate processes as needed, or may be derived from the received data 102 by analysis, the analysis deriving the knowledge of the data 108 either being performed prior to or concurrently with determining encoding values (if the computer system includes encoder 104) or concurrently with recovering the data (if the computer system includes decoder 114). Further, after the first computer system has performed the above analysis, the encoder 104 may represent the knowledge of the data 108 as one or more additional encoding values and may communicate the knowledge of the data 108 as one or more additional encoding values along with the other generated encoding values to the second computer system. In some embodiments, at least a portion of knowledge 108 may be provided using one or more of a grammar, a regular expression, a database schema, a schema language, a programming language and/or an IDL. Specific examples may include the XML Schema Language, the RelaxNG schema language, the XML DTD language, Backus-Naur Form (BNF), extended BNF, regular expressions, Java, C++, C#, C, and CORBA, but the knowledge 108 may be provided through any sort of method of data structuring known in the art. Each or all of these different ways to convey knowledge of the data 108 may be compiled down to a common knowledge representation, which may include one or more finite automata. Thus, systems using the compiled knowledge representation need not understand XML Schema Language, BNF, etc.

In other embodiments, not shown, knowledge of the data 108 is not provided to or derived by the first or second computer system, but is instead compiled separately by another system or process into one or more knowledge representations of the data, which may include finite automata. The knowledge representations, rather than knowledge of the data 108, may then be provided to the computer systems.

Additionally, as shown, networking fabric 110 may be any sort of network known in the art, such as a LAN, WAN, or the Internet. Networking fabric 110 may further utilize any sort of connection known in the art, such as Transmission Control Protocol/Internet Protocol (TCP/IP) connections, or Asynchronous Transfer Mode (ATM) virtual connections.

FIG. 2 illustrates in further detail selected aspects of an encoder of the invention, in accordance with various embodiments. Encoder 104 may be implemented as one or more processes (or hardware components), such as encoding value generation process 208, capable or receiving data, receiving or deriving a knowledge representation describing the data, which may include one or more finite automata, determining encoding values to encode the data, based at least in part on the knowledge representation, and generating the encoding values. The processes of the encoder may all be implemented on one computer system, such as the first computer system shown in FIG. 1, or on several, as a distributed process or processes on several computer systems of a network.

As shown, encoder 104 receives data 202 which the encoder 104 will represent as a shorter sequence of lower entropy values 210. Encoder 104, as described earlier, may receive the data 202 directly from one or more application or system processes, or may receive the data via an API. Data 202 may be any sequence of zero, one, or more bits, and may or may not have a structure. In various embodiments, data 202 is structured as XML data, character data, data from a database, structures defined by a programming language, and/or structures defined by an IDL. Further, some of the data items specified by the structure of data 202 and contained within data 202 may be provided to encoder 104 as one or more of the data types integer, long, short, byte, string, date, Boolean, float, double, qualified name, byte array, and/or typed list. In some embodiments, knowledge of the received data 204 (discussed more below) may facilitate automatic conversion of typed data items of data 202 from their provided types to another data type or types determined by the knowledge of the data 204.

As illustrated, knowledge of the data 204 may be any sort of structure or grammar describing the content and relationships of data known in the art. Knowledge of the data 204 may include regular expressions, database schemas, schema languages, programming languages, and/or IDLs. Specific examples include the XML Schema Language (as shown in the schema fragments of FIGS. 5a, 5c, and 6a), the RelaxNG schema language, the XML DTD language, BNF, extended BNF, Java, C, C++, C#, and CORBA. A more detailed description of knowledge of the data 204 as conveyed by XML schemas may be found below in the description of FIGS. 5a, 5c, and 6a.

As described earlier, encoder 104 may obtain knowledge of the data 204 in a plurality of ways. In some embodiments, knowledge of the data 204 may be pre-provided to encoder 104 by a user of the computer system or systems executing the encoder 104. The knowledge may be uploaded into computer system memory through a network interface or read from a storage medium. In such embodiments, no further analysis is needed and the knowledge of the data may simply be compiled into the knowledge representation, which may include one or more finite automata.

In other embodiments, encoder 104 or a related process may derive knowledge of the data 204. In various embodiments, encoder 104 may make a first pass through of data 202, deriving the structure of the data and creating knowledge of the data 204. In other embodiments, encoder 104 may derive knowledge of the data 204 concurrently with processing the data 202. In yet other embodiments, an application may provide encoder 104 with only a portion of data 202. The portion provided may be determined by one or more of a query, a path expression, a transformation, a set of changes to the data, a script, and a software program, or may be selected from the data 202 in some other fashion, including at random. Once a portion of data 202 is selected for analysis, encoder 104 may either make an initial pass through of data 202, deriving the structure of the data and creating knowledge of the data 204, or may derive knowledge of the data 204 concurrently with processing the data 202. In other embodiments, encoder 104 or some external process may derive the knowledge for encoding arbitrary subsets of the data that may be provided by an application in advance. In one embodiment, the knowledge used for encoding arbitrary subsets of the data may include a Finite Automaton that accepts a sequence of zero or more data items selected from the data. In a number of embodiments, data 202 may deviate from knowledge of the data 204, such as when knowledge of data is incomplete, inaccurate, or when only a portion of data 202 is analyzed, such as when analysis of data 202 is concurrent with the encoder 104's processing of data 202. In such embodiments, encoder 104 may be adapted to represent these deviations from knowledge of the data 204 as a part of the encoding values.

In other embodiments, knowledge of the data is not received or derived by encoder 104, but is instead compiled on a separate system or by a separate process into representations of knowledge 206, which may include one or more finite automata. Representations of knowledge 206 may then be provided directly to encoder 104, obviating the need for encoder 104 to receive or derive knowledge of data 204. In one embodiment, the representations of knowledge 206 may be provided in XML format. In one embodiment, the representations of knowledge 206 may be encoded by an encoder 104 of the current invention running on the same system or a separate system. As such, decoder 114 may be used to decode both encoding values 210 and knowledge representation 206.

In some embodiments, not all the knowledge 204 possessed by the encoder 104 may be used. For example, if the computer system having encoder 104 has engaged in a knowledge negotiation with a recipient computer system having a decoder 114 (as is discussed above in reference to FIG. 1), and the computer systems determine that the shared knowledge 108 is a subset of knowledge 204, only the subset of knowledge 204 may be compiled into knowledge representations and used to encode the data 202 (or, if pre-compiled on another system and provided, only the knowledge representations 206 representing the subset of knowledge 204 may be used).

Figures 5A, 5B:
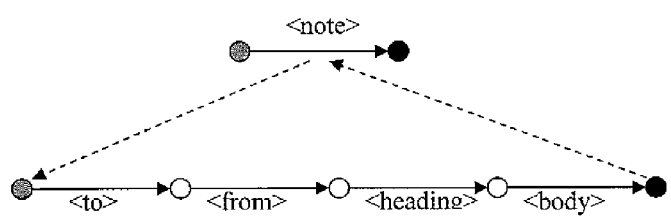
Figure 5D:
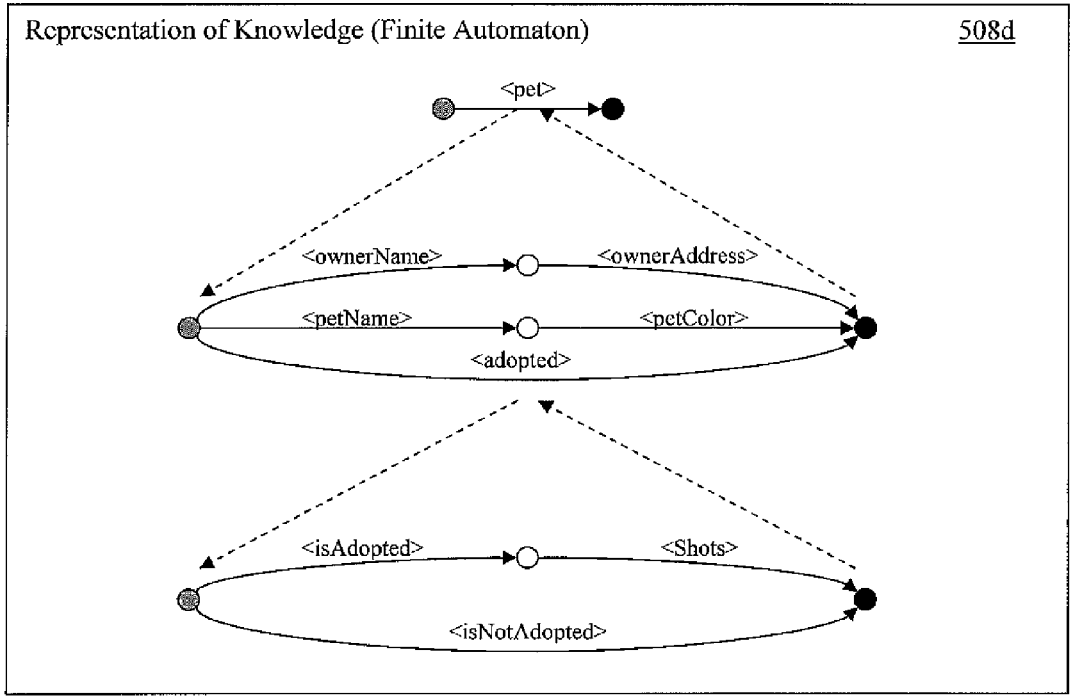

As is further illustrated, once knowledge of the data 204 is received or derived, encoder 104 or a related process (such as the knowledge representation compiling process described above) may represent knowledge of the data 204 as one or more finite automata 206 (if the knowledge 204 is derived incrementally, as the data 202 is processed to encode, the finite automata 206 may also be represented/compiled incrementally). The finite automata may be deterministic or non-deterministic, and may, in some embodiments, comprise a nested structure. In various embodiments, the finite automata 206 may comprise data structures or objects of a programming language (e.g., C++ objects) have a plurality of "nodes," each node specifying a node or nodes that may follow the current node. FIG. 5*b* illustrates an example including a first finite automaton with a second nested finite automaton. The first finite automaton accepts a <note> element. The second, nested finite automaton accepts the contents of the <note> element, which includes a <to > element followed by a <from> element followed by a <heading> element followed by a <body> element. Additional nested finite automaton (not shown) might also exist that accept the string contents of the <to > element, <from> element, among others. Each finite automaton may have one or more start states and one or more end states, each end state having no out going transitions to other nodes. Some finite automata may have one or more nodes that each has a plurality of out going transitions to possible next nodes. FIG. 5*d* illustrates another example including a first finite automaton, which has a second nested finite automaton, which has a third nested finite automaton. In that example, the first finite automaton includes a single transition that accepts the "<pet>" element. The second, nested finite automaton accepts the contents of the "<pet>" element, which may start with any one of "<ownerName>," "<petName>," and "<adopted>." The third finite automaton accepts the contents of the "<adopted>" element, which may start with "<is Adopted>" or "<is NotAdopted>."

As discussed above, in some embodiments, a transition or transitions of a finite automaton may contain references to other "nested" finite automata. For example, the transition "<note>" of a first finite automata shown in FIG. 5*b*, representing the structure of an XML document, contains a reference to a second finite automata representing the contents of the <note> element. The nesting of finite automata is further illustrated and discussed in FIG. 7.

Continuing to refer to FIG. 2, in some embodiments, nodes of the finite automata 206 may include an "anything here" or "wildcard" transition (further illustrated in FIG. 6*c*) that match any data not described by other outgoing transitions from that node to handle data 202 that deviates from the knowledge of the data 204. In some embodiments, described below, where knowledge 204 must be derived as the data 202 is encoded (effectively, where all the data 202 is treated like "deviant data"), wildcard transitions may also be effectively used to successively build the knowledge 204 and knowledge representations 206.

As mentioned above, data 202 may deviate from the structure or content described by knowledge of the data 204, in some embodiments. As the encoder 104 processes data 202 to determine and generate lower entropy encoding values 210, encoder 104 may encounter portions of data 202 that are not described by knowledge of the data 204. In one embodiment, such "deviant" data 202 that are not described by knowledge of the data 204 may match a wildcard transition in a finite automaton. In one embodiment, when data matches a wildcard transition, encoder 104 or a related process may augment finite automata 206 by adding a new transition to match future instances of the deviant data directly without the use of the wildcard. Thus, the next time the same data 202 is encountered, it will match the newly added transition instead of the wildcard transition allowing encoder 104 to encode "deviant" data more efficiently. This may be accomplished, in various embodiments, by adding an additional transition to the node from which the wildcard transition matching deviant data 202 originated, the transition being in addition to the wildcard transition. In addition, encoder 106 or a related process may add a new nested finite automaton to represent the content of the deviant data. In one embodiment, the newly added nested finite automaton includes a start state with an outgoing wildcard transition pointing back to the start state.

FIGS. 6*a*-6*c* illustrate an example. In this example, the knowledge of the data in FIG. 6*a* is a schema fragment describing a "<note>" element containing a "<to >" element followed by a "<from>" element followed by a "<heading>" element followed by a "<body>" element. However, the XML data 202 received in FIG. 6*b* has a "<date>" element following the "<heading>" element that is not described by the knowledge of data in FIG. 6*a*. Many of the nodes in FIG. 6*c* have outgoing wildcard transitions marked by * symbols in the figure. The deviant "<date>" element shown in FIG. 6*b* will first match the wildcard transition on the node pointed to by the "<heading>" transition causing the finite automaton to accept the deviant data. Accordingly, when the "<date>" element matches the wildcard transition encoder 104 or a related process may augment finite automata 206 by adding a third possible transition to the node pointed to by the "<heading>" transition, which will match future instances of the "<date>" element directly without the use of the wildcard. Thus, the finite automaton illustrated in FIG. 6*c* illustrates the augmented finite automaton, in which the "<heading>" element may be followed by a "<date>" element, a "<body>" element or anything else that matches the wildcard transition. The first time the deviant data 202 is encountered, it will match the "wildcard" transition. Encoder 104 may then generate encoding values 210 representing the wildcard transition followed by encoding values describing the deviant data (e.g., the type, name and possibly other information about the deviant data). However, because of the representation enhancements for deviations described above, the next time deviant data 202 is encountered, encoder 104 may generate an encoding value 210 representing the "<date>" transition and need not generate additional encoding values to represent the deviant data a second time (e.g., the type, name or other information about the deviant data).

As mentioned above, encoder 104 may not have any knowledge 204 describing data 202. Rather, the encoder 104 may need to derive the knowledge 204 simultaneously with encoding the data 202, in some embodiments. In such embodiments, encoder 104 may first create an empty finite automaton 206, including one node with a wildcard transition. The first time a structural element of the data 202 is encountered, it may match the wildcard transition. Encoder 104 may also enhance the finite automaton 206 by representing the element as a possible transition, thereby augmenting the finite automata 206 to represent more and more of the structure of the data 202. Additionally, encoder 104 may create another finite automaton 206, nested below the first and also comprising one node with one wildcard transition, to represent content and/or nested elements within the first structural element that may be subsequently encountered as the data 202 is processed. The transition representing the first encountered element may point to the new, nested automaton 206. Should the encoder 104 then encounter the first element again while processing data 202, the first element may now be encoded according to its represented transition, which may allow use of encoding values comprising fewer bits. If an element or content nested within the first element is then encountered, a new transition may be added by encoder 104 to the nested automaton 206. If an element was encountered, an additional automaton 206 nested down an additional level (that is, an automaton 206 nested from the nested automaton 206) may be created by the encoder 104, also comprising a node and wild card transition, and also pointed to by the new element. In such an iterative fashion, the finite automata 206 representing data 202 may be incrementally developed, requiring less and less enhancement over time as the same elements are encountered more and more frequently.

Referring to FIG. 2 again, encoder 104 or a related process may create the one or more finite automata by compiling knowledge of the data 204. For example, Xerces, the open source Apache™ XML Parser parses schemas and creates finite automata for the schemas to aid in validation. Such finite automata may be the finite automata utilized by encoder 104 to represent data 202 as lower entropy values 210. As mentioned above, a process or system separate from encoder 104 may instead compile knowledge of the data 204, and provide the compiled knowledge representation 206 to encoder 104. In some embodiments, such as those where the knowledge 204 is derived as the data 202 is encoded, the representations 206 may be compiled from the knowledge 204 incrementally, as the knowledge is derived.

As shown, an encoding value generation process 208 of encoder 104 may determine and generate smaller and more uniform, lower entropy encoding values 210 representing corresponding data 202 as a stream of bytes of encoding values 210, the determining based at least in part on the knowledge representation of data 202, which may include one or more finite automata 206. The finite automata 206 may facilitate representation of a large number of structural elements of data 202 in a small number of bit sequence values based on the location of the structural elements within a finite automaton 206. In FIG. 5d "<pet>" may contain "<ownerName>," "<petName>," or "<adopted>." Given that one of the three elements must appear in the content of "<pet>," only three distinct encoding values are required to represent the three elements (e.g., 0, 1 and 2). In one embodiment, any of these three values may be represented by at most two bits. "<ownerName>" may be represented by "00", "<petName>" may be represented by "01", and "<adopted>" may be represented by "10." Another node, not shown, may be followed by four possible transitions, which may be represented by four distinct values (e.g., 0, 1, 2 and 3). In one embodiment, the first of these transitions may be represented by the value "00." The first of these transitions does not need to have any correspondence or relation to "<ownerName>," but both may nonetheless be represented by the same value (i.e., "00"). Thus, encoder 104 may use knowledge representation 206 to map a sequence of unrelated higher entropy data 204 to a sequence of lower entropy identical or overlapping values. If a given node is followed by only a single out-going transition, the data represented by the transition may be represented by zero bits, or—in other words—represented by no encoding value.

In various embodiments, in addition to encoding elements in the above described manner, the encoder 104 may encode string values of the elements (e.g., an element <name> may have a string value of "John Smith") the using string tables. A string table may comprise an indexed list of strings, each string having a unique index, and the table itself having an index. For example, if the strings comprising data 202 are "foo," "bar," and "fuz," encoder 104 may create a string table with an entry for each string. Since there are three strings, only two bits are needed to create a unique index for each string. Thus, "foo" may have an index of "00", "bar" may have an index of "01", and "fuz" may have an index of "10".

Encoder 104 may either create the tables incrementally, as strings are encountered while encoding the data 202, or may do a first pass through of the data 202, creating an entry and index for each string. If created incrementally, the first time a string is encountered it may simply be represented by encoder 104 as a series of characters preceded by a length field. The encoder 104 may then add an entry for the string to the string table, so that the next time the string is encountered, it may be encoded by setting the string length to "0" (using the "0" length as an index for the table) and by the index of the string in the table. Accordingly, in a large set of data 202 having only the above mentioned "foo," "bar," and "fuz" repeatedly throughout, each may be encoded the first time by a length of "3" and then by the string itself. Each subsequent time the strings are encountered, however, they may be encoded as "0" followed by "00", "01", or "10". In other words, the table allows the strings to be encoded in 3 bits in subsequent appearances.

In one embodiment, rather than having one table including all strings, encoder may generate a plurality of tables of strings. For example, if data 202 includes the elements <name> and <race>, encoder 104 could create one string table for <name> values and another string table for <race> values. In yet another embodiment, encoder 104 may create both a plurality of tables divided by, for example, element type, as well as a larger string table comprising all strings in data 202.

Encoding value generation process 208 may, in some embodiments, determine the above values representing data 202 and/or the encoding values 210 that represent said values by traversing the finite automata 206 as it processes data 202. For example, if finite automata 206 have been created prior to processing data 202, process 208 may traverse the automata 206 concurrently with reading 202, and upon finding data 202 matches one of three possible transitions of a previous node, may represent the data 202 as one of three possible values (e.g., 0, 1, 2). Upon determining a value to represent data 202, encoder 104 may use a fixed 2 bit sequence to represent the value, the 2 bit sequence comprising 2 bits of a byte encoding the value. Encoder 104 may encode the shorter bit sequences as bytes to facilitate compression, if the compression algorithm used operates based on bytes (such as WinZip's Deflate).

In some embodiments, the stream of bytes of encoding values 210 may have a different ordering than corresponding portions of data 202. For example, all encoding values 210 for portions of data 202 that are of type string may be represented together, and all encoding values 210 of portions of data 202 that are of type integer may be represented together and follow the strings. In another example, encoding values 210 for portions of data 202 may be grouped by element/attribute name instead, and represented together in such groups. This may be facilitated by multiplexer 106, and may be done to further facilitate a compression algorithm such as Huffman or Lempel-Ziv.

Also, in various embodiments, values representing the algorithms used in encoding and/or the knowledge of the data 204 may further be added to the stream of encoding values 210, although the algorithms themselves need not be encoded. Further, the stream of values 210 may also represent any parameters that may have influenced the determining or generation of encoding values.

Upon generating the stream of bytes of encoding values 210, encoder 104 may send the values 210 to the multiplexer 106 to multiplex the stream of values 210, facilitating compression.

FIG. 3 illustrates in further detail selected aspects of a multiplexer of the invention, in accordance with various embodiments. As illustrated, multiplexer 106 may implement the processes of receiving a stream of bytes of encoding values, such as stream of encoding values 302, determining a plurality of substreams of bytes of encoding values from the stream of encoding values 302, splitting stream of encoding values 302 into the plurality of substreams of bytes, such as first one or more substreams 304, second one or more substreams 306, and third one or more substreams 308, based on one or more criteria, selectively recombining the substreams based on one or more additional criteria, and separately compressing some or all of the substreams and recombined substreams.

In various embodiments, stream of bytes of encoding values 302 may be received by multiplexer 106 from the encoder 104. As described above, encoder 104 may generate a plurality of smaller and/or lower entropy encoding values as bytes representing larger and/or higher entropy data, such as XML, those encoding values comprising stream 302. If encoder 104 and multiplexer 106 are part of the same computer system, as is shown in FIG. 1, encoder 104 may pass the stream 302 to multiplexer 106 via, for example, a function call or a socket. If encoder 104 and multiplexer 106 are modules of separate computing systems, the stream of encoding values 302 may be passed from the encoder 104 to the multiplexer 106 via a networking fabric or storage medium, as is described above.

As is further illustrated, first one or more substreams 304, second one or more substreams 306, and third one or more substreams 308 may be determined in any of a number of ways. Multiplexer 106 may determine a plurality of substreams of bytes of encoding values, such as substreams 304, 306, and 308, randomly, placing portions of stream of encoding values 302 at random into any number of substreams, the substreams acting as "buckets" for the byte-sized portions of the stream 302 allocated into them.

In other embodiments, stream of encoding values 302 may be split into a plurality of substreams 304, 306, and 308 based on one or more pre-determined criteria, to improve overall effectiveness in compressing stream 302. The one or more criteria may comprise metadata describing the content and/or structure of data represented by stream of encoding values 302, and the metadata may have any number of sources. The metadata may have been derived from the data itself and/or one or more descriptions of the data by encoder 104 (see knowledge of the data 204 above) or may have already been known to the computer system having multiplexer 106. The metadata may have been derived from one or more of names associated with data items, types associated with data items, and/or the content of data items. Where the metadata, such as knowledge of the data 104, was derived by encoder 104 from an XML document, the metadata serving as the one or more criteria may include element names and/or attribute names. Where the metadata was derived by encoder 104 from an XML schema, the one or more criteria may include data type names associated with XML elements, attributes and values, or base data types associated with XML elements, attributes or values, such as "String" and "Integer." Where the metadata was derived by encoder 104 from a database schema or database data, the one or more criteria may include names or types associated with database tables, rows, and/or columns. Further, the metadata may have been derived from other sources of metadata known in the art, such as grammars and/or programming languages, and the one or more criteria may include names and/or types associated with grammar productions and/or structures defined by a programming language. Metadata serving as the one or more criteria may have been determined/derived by the encoder 104 (such as knowledge of the data 204), and may be passed to multiplexer 106 with the stream of encoding values 302.

For example, if the one or more criteria comprise the base data types of data represented by portions of stream of encoding values 302, the stream 302 may be split into a plurality of substreams, with characters in one substream, strings in another, integers in a third, and reserve yet another for other or unknown data types. Thus, a stream of encoding values 302 representing data items, "a 1 2 b cat c 3 a b rabbit 1 c 2 3 3.14 . . . " might be placed into the following substreams representing data items: "a b c a b c . . . " "1 2 3 1 2 3 . . . " "cat rabbit . . . " and "3.14 . . . ", which each have lower entropy than the original stream and may compress better separately than together (assuming longer sequences than illustrated in the simple example above).

Figure 8:
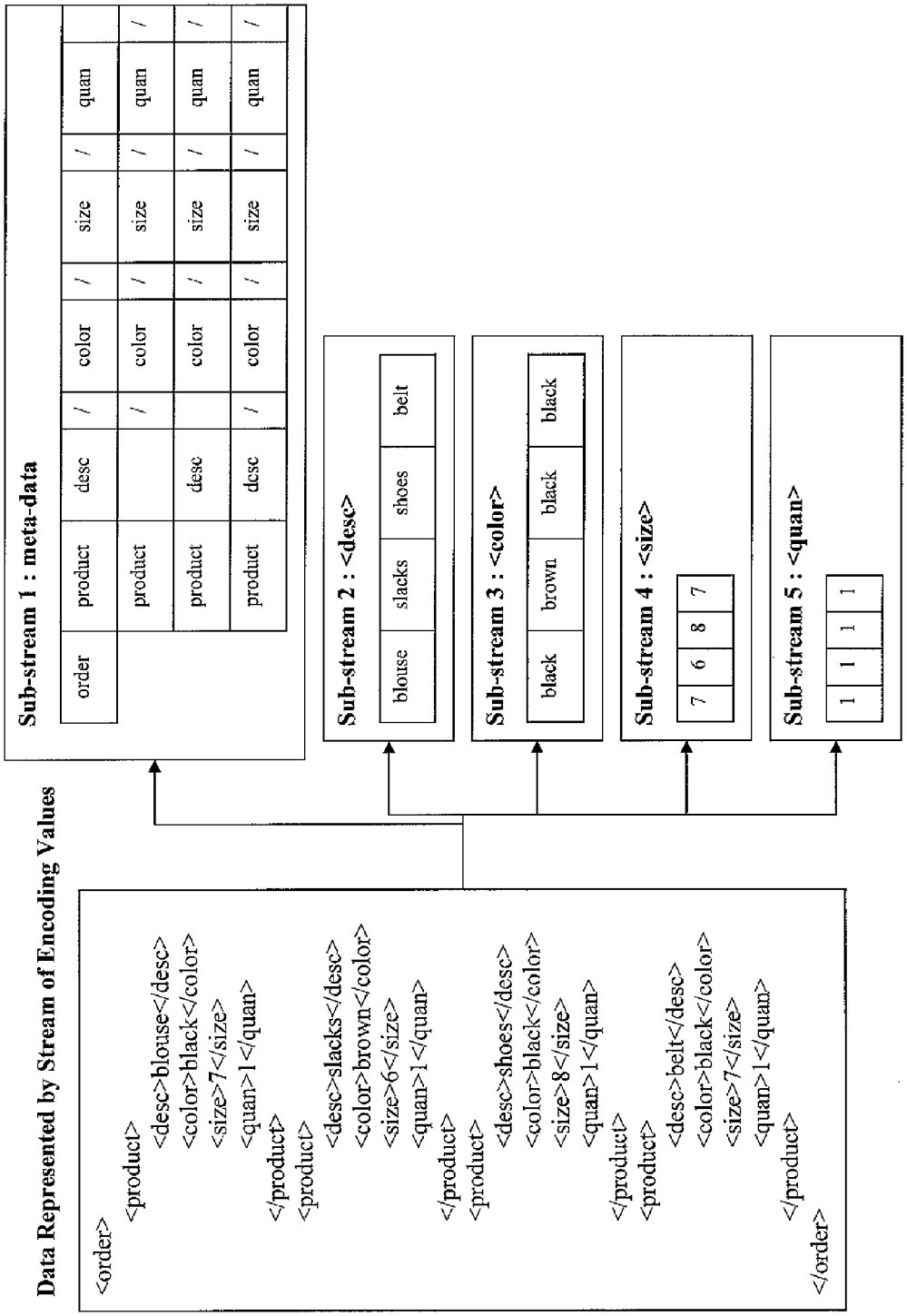
FIG. 8 illustrates exemplary data represented by substreams of encoding values generated from the received stream of encoding values, in accordance with various embodiments.

In some embodiments, multiplexer 106 may specify a substream (e.g., the first substream) representing said metadata, such that a de-multiplexer 112 may read the specified substream to retrieve said metadata and determine the criteria needed to combine the remaining substreams. In one embodiment, the specified substream containing a representation of said metadata is output and/or compressed concurrently with the first pass through of at least a portion of stream of data 302. For example, FIG. 8 illustrates exemplary data of an XML document represented by a stream of encoding values 302, wherein the XML element names provide metadata defining the sequence and structure of data items in stream of encoding values 302, and sub-stream 1 contains a representation of the metadata in one embodiment. Thus, referring to stream of encoding values 302 in FIG. 8, the multiplexer 106 may create a first substream for the metadata and separate substreams for each element/attribute name that has at least one associated value, i.e., <desc>, <color>, <size> and <quan>.

Once the multiplexer 106 has determined the plurality of substreams 304, 306, and 308, multiplexer 106 may split stream 302 into the plurality of substreams of bytes. The substreams may be created and implemented as any number of data structures, including buffers, streams, arrays, queues, and stacks, but may be implemented in any manner known in the art. Taking the example of a series of arrays, the substream splitting process may first call a function or functions initializing an array or arrays for each of the substreams. Thus, referring to the above example, the process might initialize arrays for portions of the stream 302 representing metadata and values of the <desc>, <color>, <size> and <quan> elements. Upon initializing the arrays or other data structures representing the substreams, the substream splitting process may read the received stream of encoding values 302 from the beginning of the stream to its end. As the process encounters byte-sized portions of data represented by encoding values, the process will store the portion in, for example, the initialized array associated with the metadata or a particular element name associated with the portion of data represented by the read encoding values. Referring to the example in FIG. 8, first values representing the <order> tag, would be read, and would be stored at the beginning of the metadata array. Then values representing the <product> and <desc> tags would be read, and would be stored in the next positions in the metadata array. Then, the encoding values representing the element value "blouse" would be read and stored at the beginning of the "<desc>" array. In addition, a value indicator might be written to the structure stream indicating that an element or attribute value occurred at that position in the stream (indicated in FIG. 8 by the symbol "/"). Following that, values representing a <color> tag would be read and stored in the metadata array, the element value "black" would be read and stored at the beginning of the "<color>" array and so on.

In some embodiments, each of the plurality of substreams 304, 306, and 308 may be assigned one or more identifiers based on metadata describing the stream 302. The one or more identifiers may then be used to facilitate selective recombining of the substreams of data, the selective recombining described in greater detail below.

Further, prior to recombining the substreams 304, 306, and 308, two or more of the substreams may be reordered based on one or more reordering criteria so that substreams that are likely to compress well together are adjacent. The one or more reordering criteria used for reordering two or more of the substreams may include one or more of identifiers associated with substreams, sizes associated with substreams (e.g., in bytes or number of data items represented by encoding values), data types associated with substreams, names associated with the substream, and analysis results associated with the substream, such as statistical averages of encoding values in a substream, entropies of substreams, ranges of encoding values in substreams, and frequency distributions of encoding values in substreams.

In various embodiments, one or more values of one or more of the plurality of substreams 304, 306, and 308 may also be modified based on one or more criteria to improve the relative entropy of one or more pairs of substreams. For example, a constant value may be added to encoding values in one or more sub-streams, to reduce differences in their average values, entropies, value ranges, or frequency distributions. As another example, the criteria may also comprise a map that maps each original encoding value to a different encoding value.

As is shown, two or more of the plurality of substreams may be recombined to form one or more recombined substreams 310 based on one or more criteria, to improve overall effectiveness in compressing the stream of encoding values 302. In various embodiments, the one or more criteria may include identifiers associated with the substreams, such as those mentioned above; sizes associated with the substreams, such as a substream's size in bytes; data types associated with encoding values from substreams; names associated with encoding values from substream; and analysis results of the encoding values of the substreams, such as statistical averages of encoding values in a substream, entropies of substreams, ranges of encoding values in substreams, and frequency distributions of encoding values in substreams. Substreams may be successively recombined with other adjacent or non-adjacent substreams until the one or more criteria are met. Recombined substreams themselves may be recombined with other adjacent or non-adjacent substreams or with other recombined substreams until all substreams and recombined substreams meet the one or more criteria.

For example, if one of the one or more criteria is a substream length (in bytes), the recombination process may begin by performing a function call to a method that returns a substream length (in bytes). Upon determining substream lengths (methods for which are well known in the art), substreams having a length that is smaller than the criterion might be combined. If the criterion is that the length of each substream should be greater than fifty bytes, for example, any substreams having a length that is less than fifty bytes would be recombined into recombined substreams 310. The recombined substreams 310 themselves may be recombined, either further with other recombined substreams 310, or with substreams 304, 306, and/or 308, until all substreams and recombined substreams satisfy the substream length criteria or until only one substream remains.

Further, the implementation of the recombination process may involve the creation of a new buffer, stream, array, stack, or queue, or may involve the addition of items from one existing buffer, stream, array, stack, or queue to another existing array, stack, or queue.

Also, in various embodiments, after reordering the plurality of substreams, all of the substreams may be recombined into a single recombined stream, the recombined stream compressing better than stream 302 because it now includes repeating sequences of similar adjacent items.

As is further illustrated, upon recombining the substreams into the one or more recombined substreams 310, multiplexer 106 or another process may compress the substreams 308 that have not been recombined, and the recombined substreams 310. Thus, the data to be compressed 312 includes both substreams that have not been recombined and recombined substreams 310. The compression process may be facilitated by any compression algorithm known in the art, such as Huffman, Lempel-Ziv, or Deflate. These algorithms are well known to those skilled in the art, however, and the details of their implementations need not be described further. In one embodiment, multiplexer 106 or another process may determine that one or more substreams should not be compressed at all. The determination whether to compress a particular stream or substream may be made based on metadata. The metadata may be derived from a number of sources and may include identifiers associated with substreams, sizes associated with substreams (e.g., in bytes), data types associated with data from substreams, names associated with data from the substream, and analysis results associated with the data of the substream, such as statistical averages of values in a substream, entropies of substreams, ranges of values in substreams, and frequency distributions of values in substreams.

FIG. 4 illustrates a flow chart view of selected operations needed to represent received data as encoding values, facilitated by one or more finite automata, and to split the encoding values into a plurality of substreams, in accordance with various embodiments. As illustrated, for the embodiment, encoder 104 may receive the data to be encoded, in some embodiments from one or more application or system processes of a computer system, block 402. The data received may be any sequence of zero, one, or more bits, and may or may not have a structure. In various embodiments, data is structured as XML data, character data, data from a database, structures defined by a programming language, and/or structures defined by an IDL. Further, data items contained within data may be provided to encoder 104 as one or more of the data types integer, long, short, byte, string, date, Boolean, float, double, qualified name, byte array, and/or typed list. In some embodiments, knowledge of the received data (discussed more below) may facilitate automatic conversion of typed data items of data from their provided types to another data type or types determined by the knowledge of the data.

As is further shown, encoder 104 may obtain knowledge of the data by receiving the knowledge, block 404, deriving the knowledge, block 406, or performing some combination of these operations. In some embodiments, the knowledge of the data may be pre-provided to/received by encoder 104 by a user of the computer system or systems executing the encoder 104 or other systems, block 404. The knowledge may be uploaded into computer system memory through a network interface or read from a storage medium.

In other embodiments, when the knowledge of the data is not pre-provided or fully provided, encoder 104 or a related process may derive the knowledge of the data, block 406. In various embodiments, encoder 104 may make a first pass through of the data, deriving the structure of the data and creating the knowledge of the data. In some embodiments, encoder 104 may derive the knowledge of the data concurrently with processing the data. In yet other embodiments, encoder 104 may analyze only a portion of the data. The portion provided may be determined by one or more of a query, a path expression, a transformation, a set of changes to the data, a script, and a software program, or may be selected from the data in some other fashion, including at random. Once a portion of the data is selected for analysis, encoder 104 may either make an initial pass through the data, deriving the structure of the data and creating the knowledge of the data, or may derive the knowledge of the data concurrently with processing the data. In other embodiments, encoder 104 or some external process may derive knowledge for encoding arbitrary subsets of the data that may be provided by an application in advance. In one embodiment, the knowledge used for encoding arbitrary subsets of the data may include a finite automaton that accepts a sequence of zero or more data items selected from the data. In one embodiment, said finite automaton may have a start node with a separate out-going transition for data items defined in the knowledge of data. The transitions may, in turn, point back to said start node.

In a number of embodiments, the data may deviate from the knowledge of the data, such as when knowledge of the data is incomplete, inaccurate, or when only a portion of the data is analyzed, or such as when analysis of the data is concurrent with the encoder 104's processing of the data. In such embodiments, encoder 104 may be adapted to represent these deviations from knowledge of the data as a part of the encoding values. In addition, encoder 104 may modify knowledge of the data to incorporate knowledge of deviations encountered, for example by modifying and/or adding one or more finite automata representing the knowledge of the deviations.

In other embodiments, knowledge of the data is not received or derived by the encoder 104, but is instead compiled on a separate system or by a separate process into representations of knowledge, which may include one or more finite automata. Encoder 106 may then directly receive the compiled knowledge representations from the separate system/process, obviating the need for the encoder 104 to receive or process knowledge of data. In on embodiment, the representations of knowledge may be provided in XML format. In one embodiment, the representations of knowledge may be encoded by an encoder 104 of the current invention running on the same system or a separate system. As such, a decoder 114 may be used to decode both encoding values and knowledge representations.

In some embodiments, not all the knowledge of the data possessed by the encoder 104 may be used. For example, if the computer system having encoder 104 has engaged in a content/knowledge negotiation with a recipient computer system having a decoder 114, block 410, and the computer systems determine that the shared knowledge 108 is a subset of the knowledge of the date, only the subset of the knowledge of the data may be compiled into knowledge representations and used to encode the data (or, if pre-compiled on another system and provided, only the knowledge representations representing the subset of the knowledge of the data may be used).

As is further illustrated, once the knowledge of the data is received or derived, encoder 104 or a related process may represent knowledge of the data as one or more finite automata, block 412. The finite automata may be deterministic or non-deterministic, and may, in some embodiments, comprise a nested structure. In various embodiments, the finite automata may comprise data structures or objects of a programming language (e.g., C++ objects) have a plurality of "nodes," each node specifying a node or nodes that may follow the current node. FIG. 5d illustrates an example including a first finite automaton, which has a second nested finite automaton, which has a third nested finite automaton. In that example, the first finite automaton includes a single transition that accepts the "<pet>" element. The second, nested finite automaton accepts the contents of the "<pet>" element, which may start with any one of "<ownerName>," "<petName>," and "<adopted>." The third finite automaton accepts the contents of the "<adopted>" element, which may start with "<is Adopted>" or "<is NotAdopted>."

As discussed above, in some embodiments, a transition or transitions of a finite automaton may contain references to other "nested" finite automata. FIG. 5b illustrates an example including a first finite automaton with a second nested finite automaton. The first finite automaton accepts a <note> element. The second, nested finite automaton accepts the contents of the <note> element, which includes a <to > element followed by a <from> element followed by a <heading> element followed by a <body> element. Additional nested finite automaton (not shown) might also exist that accept the string contents of the <to > element, <from> element, and others.

Further, in some embodiments, nodes of the finite automata may include an "anything here" or "wildcard" transition that match any data not described by other outgoing transitions from that node to handle data that deviates from the knowledge of the data. In some embodiments, described below, where the knowledge of the data must be derived as the data is encoded, wildcard transitions may also be effectively used to successively build the knowledge of the data and knowledge representations.

Referring to FIG. 4 again, as mentioned above, the data may deviate from the structure or content described by the knowledge of the data, in some embodiments. As the encoder 104 processes the data to determine and generate lower entropy encoding values, encoder 104 may encounter portions of the data that are not described by a part of the knowledge of the data. In one embodiment, such "deviant" data that are not described by the knowledge of the data may match a wildcard transition in a finite automaton. In one embodiment, when data matches a wildcard transition, encoder 104 or a related process may augment the finite automata by adding a new transition to match future instances of the deviant data directly without the use of the wildcard. Thus, the next time the same data is encountered, it will match the newly added transition instead of the wildcard transition allowing the encoder to encode "deviant" data more efficiently. This may be accomplished, in various embodiments, by adding an additional transition to the node from which the wildcard transition matching the deviant data originated, the transition being in addition to the wildcard transition. In addition, the encoder or a related process may add a new nested finite automaton to represent the content of the deviant data. In one embodiment, the newly added nested finite automaton includes a start state with an outgoing wildcard transition pointing back to the start state.

As mentioned above, encoder 104 may not have any knowledge of the data describing the data. Rather, the encoder 104 may need to derive the knowledge of the data simultaneously with encoding the data, in some embodiments. In such embodiments, encoder 104 may first create an empty finite automaton, including one node with a wildcard transition. The first time a structural element of the data is encountered, it may match the wildcard transition. Encoder 104 may also enhance the finite automaton by representing the element as a possible transition, thereby augmenting the finite automata to represent more and more of the structure of the data. Additionally, encoder 104 may create another finite automaton, nested below the first and also comprising one node with one wildcard transition, to represent content and/or nested elements within the first structural element that may be subsequently encountered as the data is processed. The transition representing the first encountered element may point to the new, nested automaton. Should the encoder 104 then encounter the first element again while processing the data, the first element may now be encoded according to its represented transition, which may allow use of encoding values comprising fewer bits. If an element or content nested within the first element is then encountered, a new transition may be added by encoder 104 to the nested automaton. If an element was encountered, an additional automaton nested down an additional level (that is, an automaton nested from the nested automaton) may be created by the encoder 104, also comprising a node and wild card transition, and also pointed to by the new element. In such an iterative fashion, the finite automata representing the data may be incrementally developed, requiring less and less enhancement over time as the same elements are encountered more and more frequently.

Encoder 104 or a related process may create the one or more finite automata by compiling the knowledge of the data. For example, Xerces, the open source Apache™ XML Parser parses schemas and creates finite automata for the schemas to aid in validation. Such finite automata may be the finite automata utilized by encoder 104 to represent data as lower entropy values. In some embodiments, such as those where the knowledge of the data is derived as the data is encoded, the representations may be compiled from the knowledge of the data incrementally, as the knowledge is derived.

As shown, an encoding value generation process of encoder 104 may determine and generate smaller and more uniform, lower entropy encoding values representing corresponding data, blocks 414-416, the determining based at least in part on the knowledge representation of data, which may include one or more finite automata. The finite automata may facilitate representation of a large number of structural elements of data in a small number of bit sequence values based on the location of the structural elements within a finite automaton. In FIG. 5d "<pet>" may contain "<ownerName>," "<petName>," or "<adopted>." Given that one of the three elements must appear in the content of "<pet>," only three distinct encoding values are required to represent the three elements (e.g., 0, 1 and 2). In one embodiment, any of these three values may be represented by at most two bits. "<ownerName>" may be represented by "00", "<petName>" may be represented by "01", and "<adopted>" may be represented by "10." Another node, not shown, may be followed by four possible transitions, which may be represented by four distinct values (e.g., 0, 1, 2 and 3). In one embodiment, the first of these transitions may be represented by the value 0. The first of these transitions does not need to have any correspondence or relation to "<ownerName>," but both may nonetheless be represented by the same value (i.e., 0). Thus, encoder 104 may use the knowledge representation to map a sequence of unrelated higher entropy data to a sequence of lower entropy identical or overlapping values. If a given node is followed by only a single out-going transition, the data represented by the transition may be represented by zero bits, or—in other words—represented by no encoding value.

In various embodiments, in addition to encoding elements in the above described manner, the encoder 104 may determine and generate encoding values for string values of the elements (e.g., an element <name> may have a string value of "John Smith") using string tables, blocks 414-416. A string table may comprise an indexed list of strings, each string having a unique index, and the table itself having an index. For example, if the strings comprising data 202 are "foo," "bar," and "fuz," encoder 104 may create a string table with an entry for each string. Since there are three strings, only two bits are needed to create a unique index for each string. Thus, "foo" may have an index of "00", "bar" may have an index of "01", and "fuz" may have an index of "10".

Encoder 104 may either create the tables incrementally, as strings are encountered while encoding the data, or may do a first pass through of the data, creating an entry and index for each string. If created incrementally, the first time a string is encountered it may simply be represented by encoder 104 as a series of characters preceded by a length field. The encoder 104 may then add an entry for the string to the string table, so that the next time the string is encountered, it may be encoded by setting the string length to "0" (using the "0" length as an index for the table) and by the index of the string in the table. Accordingly, in a large set of data having only the above mentioned "foo," "bar," and "fuz" repeatedly throughout, each may be encoded the first time by a length of "3" and then by the string itself. Each subsequent time the strings are encountered, however, they may be encoded as "0" followed by "00", "01", or "10". In other words, the table allows the strings to be encoded in 3 bits in subsequent appearances.

In one embodiment, rather than having one table including all strings, encoder may generate a plurality of tables of strings. For example, if the data includes the elements <name> and <race>, encoder 104 could create one string table for <name> values and another string table for <race> values. In yet another embodiment, encoder 104 may create both a plurality of tables divided by, for example, element type, as well as a larger string table comprising all strings in the data.

In various embodiments, the determining, block 414, may be facilitated by traversing the finite automata as the encoder 104 processes the data. For example, if the finite automata have been created prior to processing the data, encoder 104 may traverse the automata concurrently with reading the data, and upon finding that the data matches one of three possible transitions of a previous node, may represent the data as one of three possible values (e.g., 0, 1, 2). Also, in various embodiments, values representing the knowledge of the data may further be added to the encoding values, although such values need not be encoded. Encoder 104 may encode the shorter bit sequences as bytes to facilitate compression, if the compression algorithm used operates based on bytes (such as WinZip's Deflate).

In various embodiments, stream of bytes of encoding values may be received by multiplexer 106 from the encoder 104, upon the generation of those values by the encoder 104, block 416. If encoder 104 and multiplexer 106 are part of the same computer system, as is shown in FIG. 1, encoder 104 may pass the stream to multiplexer 106 via, for example, a function call or a socket. If encoder 104 and multiplexer 106 are modules of separate computing systems, the stream of encoding values may be passed from the encoder 104 to the multiplexer 106 via a networking fabric or storage medium, as is described above.

Multiplexer 106 may determine a plurality of substreams in any of a number of ways. Multiplexer 106 may determine a plurality of substreams of bytes of encoding values randomly, placing portions of stream of encoding values at random into any number of substreams, the substreams acting as "buckets" for the byte-sized portions of the stream allocated into them. In other embodiments, stream of encoding values may be split into a plurality of substreams, block 418, based on one or more pre-determined criteria, to improve overall effectiveness in compressing the stream. The one or more criteria may comprise metadata describing the content and/or structure of data represented by stream of encoding values, and the metadata may have any number of sources. The metadata may have been derived from the data itself and/or one or more descriptions of the data by encoder 104 (see knowledge of the data 204 above) or may have already been known to the computer system having multiplexer 106. The metadata may have been derived from one or more of names associated with data items, types associated with data items, and/or the content of data items. Metadata serving as the one or more criteria may be passed to multiplexer 106 with the stream of encoding values.

In some embodiments, multiplexer 106 may specify a substream (e.g., the first substream) representing said metadata, such that a de-multiplexer 112 may read the specified substream to retrieve said metadata and determine the criteria needed to combine the remaining substreams. In one embodiment, the specified substream containing a representation of said metadata is output and/or compressed concurrently with the first pass through of at least a portion of the stream of data. For example, FIG. 8 illustrates exemplary data of an XML document represented by a stream of encoding values, wherein the XML element names provide metadata defining the sequence and structure of data items in the stream of encoding values, and sub-stream 1 contains a representation of the metadata in one embodiment. Thus, referring to stream of encoding values in FIG. 8, the multiplexer 106 may create a first substream for the metadata and separate substreams for each element/attribute name that has at least one associated value, i.e., <desc>, <color>, <size> and <quan>.

Once the multiplexer 106 has determined the plurality of substreams, multiplexer 106 may split the stream into the plurality of substreams of bytes, block 418. The substreams may be created and implemented as any number of data structures, including buffers, streams, arrays, queues, and stacks, but may be implemented in any manner known in the art. The encoded elements and values may then be split into their appropriate substreams, and, in one embodiment, a value indicator might be written to the structure stream indicating that an element or attribute value occurred at that position in the stream (indicated in FIG. 8 by the symbol "/").

In some embodiments, each of the plurality of substreams may be assigned one or more identifiers based on metadata describing the stream. The one or more identifiers may then be used to facilitate selective recombining of the substreams of data.

As is shown, two or more of the plurality of substreams may be recombined to form one or more recombined substreams, block 422, if any of the substreams match one or more criteria, block 420, to improve overall effectiveness in compressing the stream of encoding values. In various embodiments, the one or more criteria may include identifiers associated with the substreams, such as those mentioned above; sizes associated with the substreams, such as a substream's size in bytes; data types associated with encoding values from substreams; names associated with encoding values from substream; and analysis results of the encoding values of the substreams, such as statistical averages of encoding values in a substream, entropies of substreams, ranges of encoding values in substreams, and frequency distributions of encoding values in substreams. Substreams may be successively recombined with other adjacent or non-adjacent substreams until the one or more criteria are met, blocks 420-422. Recombined substreams themselves may be recombined with other adjacent or non-adjacent substreams or with other recombined substreams until all substreams and recombined substreams meet the one or more criteria.

Further, the implementation of the recombination process may involve the creation of a new buffer, stream, array, stack, or queue, or may involve the addition of items from one existing buffer, stream, array, stack, or queue to another existing array, stack, or queue.

As is further illustrated, upon recombining the substreams into the one or more recombined substreams, multiplexer 106 or another process may compress the substreams that have not been recombined, and the recombined substreams, block 424. The compression process may be facilitated by any compression algorithm known in the art, such as Huffman, Lempel-Ziv, or Deflate. These algorithms are well known to those skilled in the art, however, and the details of their implementations need not be described further. In one embodiment, multiplexer 106 or another process may determine that one or more substreams should not be compressed at all. The determination whether to compress a particular stream or substream may be made based on metadata. The metadata may be derived from a number of sources and may include identifiers associated with substreams, sizes associated with substreams (e.g., in bytes), data types associated with data from substreams, names associated with data from the substream, and analysis results associated with the data of the substream, such as statistical averages of values in a substream, entropies of substreams, ranges of values in substreams, and frequency distributions of values in substreams.

As is shown, the computer system having multiplexer 106 may then send the compressed plurality of substreams to a computer system having a de-multiplexer 112, in some embodiments across a networking fabric, block 426. In other embodiments, the compressed substreams may be written onto a storage medium and provided via that medium to a computer system having a de-multiplexer 112.

FIGS. 5a-5d illustrate exemplary schemas providing knowledge of the received data, and finite automata representing those schemas, in accordance with various embodiments of the invention.

As alluded to earlier, FIG. 5a illustrates an XML Schema Fragment, Knowledge of the data 502a. Knowledge of the data 502a does not illustrate a complete schema document, but rather a sequence and structure of schema elements. Schemas may comprise simple elements, which are elements that may only comprise text or numbers, and complex elements, which may comprise other elements. As shown, 502a contains one complex element, "<note>," and four simple elements. The four simple elements are contained within a "<xs:sequence>" element, which requires its child elements to all be present and to be in the specified order. Thus, XML data conforming to knowledge of the data 502a will have a note element, containing "<to >," "<from>," "<heading>," and "<body>" elements in sequence. Any of the elements contained in "<note>" may have content of the data type "string."

In various embodiments, the knowledge of the data is derived from the received XML data by analysis of the data or a portion of the data. If all of the data has been analyzed, there will be no deviations from the derived knowledge of the data, and all received data will fit the description provided by the knowledge of the data. If, however, only a portion of the data is analyzed by encoder 104, or encoder 104 receives knowledge of the data 502a in some other fashion, such as having knowledge 502a pre-provided, XML data received by encoder 104 may not conform to knowledge of the data 502a. When this eventuality is encountered, encoder 104 handles it in the manner illustrated by FIG. 6a-6c.

FIG. 5b illustrates an example 504b representing knowledge of the data 502a, including a first finite automaton with a second nested finite automaton. As described above, compiling knowledge of the data 502a may generate finite automata 504b. Finite automata 504b represent the structure of received data, here corresponding to knowledge of the data 502a. Also, the finite automata may be deterministic or non-deterministic, and may, in some embodiments such as those illustrated here, comprise a nested structure. In various embodiments, finite automata 504b may comprise data structures or objects of a programming language (e.g., C++ objects) having a plurality of "nodes," each node specifying a next node or nodes that may follow. Thus, the first finite automaton accepts a "<note>" element. The second, nested finite automaton accepts the contents of the "<note>" element, which includes a <to > element followed by a <from> element followed by a <heading> element followed by a <body> element. Additional nested finite automaton (not shown) might also exist that accept the string contents of the <to > element, <from> element, among others. Each finite automaton may have one or more start states and one or more end states, each end state having no out going transitions to other nodes. Some finite automata may have one or more nodes that each has a plurality of out going transitions to possible next nodes.

FIG. 5c illustrates an XML Schema Fragment, Knowledge of the data 506c. Knowledge of the data 506c does not illustrate a complete schema document, but rather a sequence and structure of schema elements. As shown, 506c contains two complex elements, "<pet>" and "<adopted>," three groups of elements, such as "ownergroup," and seven simple elements. An element group allows a schema to separately declare and later refer to a sequence of elements. Also shown as part of knowledge of the data 506c is the <xs:choice> element, which specifies one or more elements, any of which may follow the complex element in which they are declared.

In various embodiments, knowledge of the data 506c is derived from the received XML data by analysis of the data or a portion of the data. If all of the data has been analyzed, there will be no deviations from the schema, and all received data will fit the description provided by the schema. If, however, only a portion of the data is analyzed by encoder 104, or encoder 104 receives knowledge of the data 506c in some other fashion, such as having knowledge 506c pre-provided, XML data received by encoder 104 may not conform to knowledge of the data 506c. When this eventuality is encountered, encoder 104 handles it in the manner illustrated by FIG. 6a-6c.

FIG. 5d illustrates finite automata 508d representing knowledge of the data 506c, including a first finite automaton, which has a second nested finite automaton, which has a third nested finite automaton. As described above, compiling knowledge of the data 506c may generate finite automata 508d. Finite automata 508d represent the structure of received data, here corresponding to knowledge of the data 506c. Also, the finite automata may be deterministic or non-deterministic, and may, in some embodiments, comprise a nested structure. In various embodiments, finite automata 508d may comprise data structures or objects of a programming language (e.g., C++ objects) having a plurality of "nodes," each node specifying a next node or nodes that may follow. Thus, the first finite automaton includes a single transition that accepts the "<pet>" element. The second, nested finite automaton accepts the contents of the "<pet>" element, which may start with any one of "<ownerName>," "<petName>," and "<adopted>." The third finite automaton accepts the contents of the "<adopted>" element, which may start with "<is Adopted>" or "<is NotAdopted>." Each finite automaton may have one or more start states and one or more end states, each end state having no out going transitions to other nodes.

As alluded to earlier, FIGS. 6a-6c illustrate an exemplary schema providing knowledge of the received data, received XML data having deviations from the knowledge of the data, and a finite automaton representing both the knowledge of the data and deviations from the knowledge of the data, in accordance with various embodiments of the invention.

FIG. 6a illustrates an XML Schema Fragment, Knowledge of the data 602a. Knowledge of the data 502a does not illustrate a complete schema document, but rather a sequence and structure of schema elements. As shown, 602a contains one complex element, "note," and four simple elements. Thus, XML data conforming to knowledge of the data 602a will have a "<note>" element containing a "<to >" element followed by a "<from>" element followed by a "<heading>" element followed by a "<body>" element. Any of the elements after note may have content of the data type "string."

FIG. 6b illustrates an XML data fragment 604b deviating from the knowledge of the data 602a. Data 604b has a "<note>" element, followed by "<to >," "<from>," and "<heading>," elements in sequence. However, instead of having "<body>" directly follow "<heading>," as specified by the knowledge of the data 602a, data 604b specifies a "<date>" element between "<heading>" and "<body>." In all other aspects, however, data 604b conforms to knowledge of the data 602a.

FIG. 6c illustrates finite automata 606c representing knowledge of the data 602a and the deviation from the schema found in data 604b. Many of the nodes in FIG. 6c have outgoing wildcard transitions marked by * symbols in the figure. The deviant "<date>" element shown in FIG. 6b will first match the wildcard transition on the node pointed to by the "<heading>" transition causing the finite automaton to accept the deviant data. Accordingly, when the "<date>" element matches the wildcard transition encoder 104 or a related process may augment the finite automata by adding a third possible transition to the node pointed to by the "<heading>" transition, which will match future instances of the "<date>" element directly without the use of the wildcard. Thus, the finite automaton illustrated in FIG. 6c illustrates the augmented finite automaton, in which the "<heading>" element may be followed by a "<date>" element, a "<body>" element or anything else that matches the wildcard transition. The first time the deviant data 604b is encountered, it will match the "wildcard" transition. Encoder 104 may then generate encoding values representing the wildcard transition followed by encoding values describing the deviant data (e.g., the type, name and possibly other information about the deviant data). However, because of the representation enhancements for deviations described above, the next time deviant data is encountered, encoder 104 may generate an encoding value representing the "<date>" transition and need not generate additional encoding values to represent the deviant data a second time (e.g., the type, name or other information about the deviant data).

Figure 7:
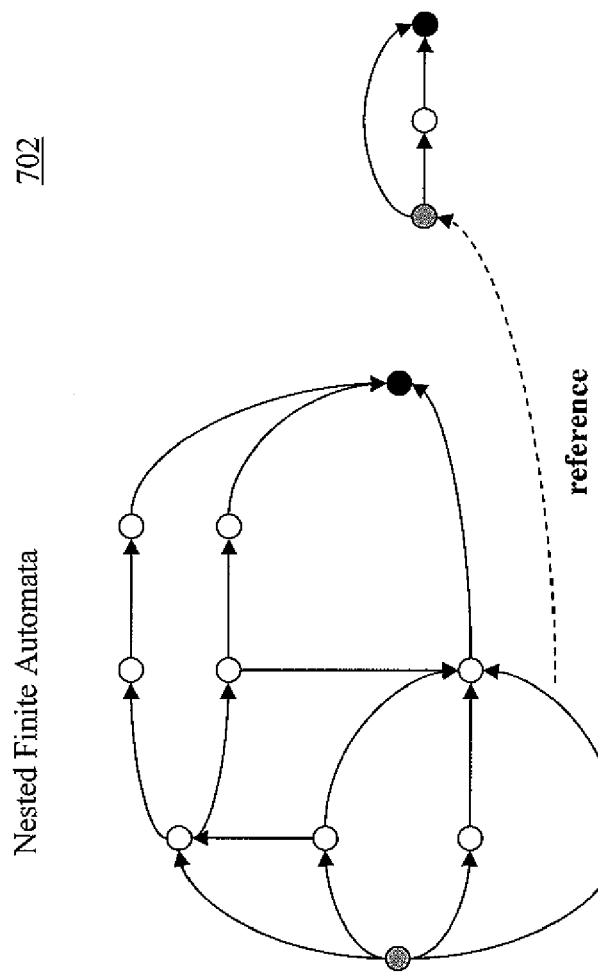
FIG. 7 illustrates exemplary, nested finite automata representing knowledge of the received data, in accordance with various embodiments of the invention.

FIG. 7 illustrates exemplary, nested finite automata representing knowledge of the received data, in accordance with various embodiments of the invention. As shown, a transition or transitions of a finite automaton may contain references to other "nested" finite automata. For example, a transition "<note>" of a finite automaton may contain a reference to another finite automaton representing an element of "<note>," such as "<to >." This might mean, for example, having the "<note>" transition reference a finite automaton for the "<to >" element. The implementation of the reference between finite automata may vary based on implementation. In some embodiments, where the automata are represented by C++ or Java objects, the reference may be a member variable of one finite automaton objects that acts as a pointer to another finite automaton object. Nesting of objects, however, is well known in the art and may be achieved in any number of ways, including the use of named references, such as XML element types.

FIG. 8 illustrates exemplary data represented by substreams of encoding values generated from the received stream of encoding values, in accordance with various embodiments. Illustrated are the stream of encoding values, representing an XML document, and five substreams generated from that received stream of encoding values. Substream 1 shows a representation of metadata defining the sequence and structure of the data items in the stream of encoding values. Each "/" symbol in substream 1 represents a position where the associated data item might be found in another substream associated with the previous metadata item. Substreams 2 through 5 shown here have been determined based on the XML element names occurring in the stream of data, the XML element names serving as the one or more criteria. Here, substreams 2 through 5 correspond to four XML elements, "<desc>", "<color>", "<size>" and "<quan>". The criterion might specify substreams for each of these four XML elements or may specify substreams for one or more of the XML elements occurring in the document and also specify another substream for all data items not matching the one or more specified XML elements. The XML elements used to determine substreams and their corresponding encoding values may be provided in advance.

FIG. 9 illustrates in further detail selected aspects of a de-multiplexer of the invention, in accordance with various embodiments. As illustrated, de-multiplexer 112 may implement the processes of receiving a plurality of compressed substreams of bytes of encoding values, such as plurality of substreams 902, decompressing the substreams 902, determining if any of the substreams 902 are aggregated/re-combined substreams, splitting the aggregated substreams 902 into split substreams 904, determining how to combine the plurality of substreams 902 and split streams 904, and combining the substreams 902 and split substreams 904 (shown as "substreams to be combined 906") into the stream of encoding values 908.

In various embodiments, a plurality of substreams of bytes of encoding values 902 may be received by de-multiplexer 106 from another computer system having encoder 104 and/or multiplexer 106 via a networking fabric or storage medium, in the manner described above in reference to FIG. 1. The plurality of substreams 902 may comprise a plurality of smaller and/or lower entropy encoding values as bytes representing larger and/or higher entropy data, such as XML.

In some embodiments, prior to splitting the aggregated substreams 902 and combining the substreams 902/904 into the combined stream of encoding values 908, de-multiplexer 112 or another process may de-compress each of the plurality of substreams 902. The de-compression process may be facilitated by any compression algorithm known in the art, such as Huffman, Lempel-Ziv, or Deflate. These algorithms are well known to those skilled in the art, however, and the details of their implementations need not be described further. In one embodiment, de-multiplexer 112 or another process may determine that one or more substreams have not been compressed. The determination whether a substream has not been compressed may be made based on metadata. The metadata may be derived from a number of sources and may include identifiers associated with substreams, sizes associated with substreams (e.g., in bytes), data types associated with data from substreams, names associated with data from the substream, and analysis results associated with the data of the substream, such as statistical averages of values in a substream, entropies of substreams, ranges of values in substreams, and frequency distributions of values in substreams.

As is shown, one or more of the plurality of substreams 902 may be determined to be an aggregated/recombined substream (such as recombined substream 310, discussed above) and may be split into split substreams 904, based on the one or more criteria used by multiplexer 106 to split the substreams. To determine which substreams 902 are recombined substreams, de-multiplexer 112 may first determine whether a substream 902 includes a field indicating that the substream 902 is a recombined substream. The field may be or may not be encoded. If encoded, the field may be sent to the decoder 112 for decoding. The field may field may also include indicia of how many substreams comprise the aggregated substream 902, and which portions belong to which substream. In other embodiments, if no field is included, de-multiplexer 112 may determine the one or more criteria used to split the original stream into a plurality of substreams (described above in reference to FIG. 3), and may apply the criteria to all of the substreams, or only those substreams including a field indicating that the substream is an aggregated substream. By applying the one or more criteria used by the multiplexer 106 to split the stream of encoding values 302, de-multiplexer 112 may be able to arrive at the post-split, pre-recombination substreams 304, 306, and 308 (which may be the same as "substreams to be combined 906"). The one or more criteria are discussed in greater detail below in reference to combining substreams 906 into stream 908.

Further, the implementation of the substream splitting process may involve the creation of a new buffer, stream, array, stack, or queue. De-multiplexer 112 may initialize such a data structure, which may have the same type as the data structures comprising substreams 902, and in splitting aggregated substreams 902 may place one split substream 904 into the newly initialized structure, and may remove that portion from the aggregated substream 902, such that the aggregated substream 902 may become another split substream 904.

Further, prior to combining the substreams 906, two or more of the substreams may be reordered based on one or more reordering criteria. Such substreams 906 may have been reordered by the multiplexer 106 so that substreams that were likely to compress well together were adjacent. De-multiplexer 112 may reorder the substream to reverse the reordering of the multiplexer 106, putting the substreams 906 in the order they were before they were reordered by the multiplexer 106. The one or more reordering criteria may include one or more of identifiers associated with substreams, sizes associated with substreams (e.g., in bytes or number of data items represented by encoding values), data types associated with substreams, names associated with the substream, and analysis results associated with the substream, such as statistical averages of encoding values in a substream, entropies of substreams, ranges of encoding values in substreams, and frequency distributions of encoding values in substreams. Both multiplexer 106 and de-multiplexer 112 may apply the same reordering criteria, the de-multiplexer 112 applying the criteria in reverse from the multiplexer 106.

In various embodiments, one or more values of one or more of the plurality of substreams 906 may also be modified based on one or more criteria. The modification may be the reverse to a modification made based on the same one or more criteria by the multiplexer 106. For example, multiplexer 106 may have added a constant value may to encoding values in one or more sub-streams, to reduce differences in their average values, entropies, value ranges, or frequency distributions, and de-multiplexer 112 may subtract the same value. As another example, the criteria may also comprise a map that maps each original encoding value to a different encoding value. In such a case, the de-multiplexer 112 may map the different encoding values received in substreams 906 back to the original encoding values.

As is further illustrated, combined stream of encoding values 908 may be determined by de-multiplexer 112 in any of a number of ways. Multiplexer 106 may have determined a plurality of substreams of bytes of encoding values, such as substreams 906, randomly, placing portions of a stream of encoding values at random into any number of substreams, the substreams acting as "buckets" for the byte-sized portions of the stream allocated into them. By applying the same randomization algorithm to substreams 906 in reverse, de-multiplexer 112 may reproduce the original stream of encoding values as combined stream of encoding values 908.

In other embodiments, combined stream of encoding values 908 may be determined by de-multiplexer 112 based on one or more pre-determined criteria, which may be the same criteria used by multiplexer 106 to split the original stream of encoding values. The one or more criteria may comprise metadata describing the content and/or structure of data represented by plurality of substreams 902, and the metadata may have any number of sources. The metadata may have been originally derived from the data itself and/or one or more descriptions of the data by encoder 104 (see knowledge of the data 204 above) or may have already been known to the computer system having multiplexer 106. The multiplexer 106 may then have created a substream comprised of the metadata, as is shown in FIG. 8, and may have provided this substream 902 to the de-multiplexer 112 first as a "control stream," which may inform the de-multiplexer 112 of the metadata. The metadata may have been derived from one or more of names associated with data items, types associated with data items, and/or the content of data items. Where the metadata, such as knowledge of the data 204, was derived by encoder 104 from an XML document, the metadata serving as the one or more criteria may include element names and/or attribute names. Where the metadata was derived by encoder 104 from an XML schema, the one or more criteria may include data type names associated with XML elements, attributes and values, or base data types associated with XML elements, attributes or values, such as "String" and "Integer." Where the metadata was derived by encoder 104 from a database schema or database data, the one or more criteria may include names or types associated with database tables, rows, and/or columns. Further, the metadata may have been derived from other sources of metadata known in the art, such as grammars and/or programming languages, and the one or more criteria may include names and/or types associated with grammar productions and/or structures defined by a programming language. Metadata serving as the one or more criteria may have been determined/derived by the encoder 104 (such as knowledge of the data 204), may be passed to multiplexer 106 with the stream of encoding values 302, and then subsequently passed to de-multiplexer 112 as a substream of encoding values representing the metadata.

For example, if the one or more criteria comprise the base data types of data represented by portions of stream of encoding values 302, the stream 302 may have been split into a plurality of substreams, with metadata/structure in one substream, strings in another, integers in a third, characters in a fourth, and another reserved for other or unknown data types. Thus, a stream of encoding values 302 representing data items, "a 1 2 b cat c 3 a b rabbit 1 c 2 3 3.14 . . . " might have been placed into the following substreams representing data items: "a b c a b c . . . " "1 2 3 1 2 3 . . . " "cat rabbit . . . " and "3.14 . . . ", which each have lower entropy than the original stream and may have compressed better separately than together (assuming longer sequences than illustrated in the simple example above).

As mentioned, one substream (e.g., the first substream) may represent the metadata, such that de-multiplexer 112 may read the specified substream to retrieve said metadata and determine the criteria needed to combine the remaining substreams. For example, FIG. 8 illustrates exemplary data of an XML document represented by a stream of encoding values 302, wherein the XML element names provide metadata defining the sequence and structure of data items in stream of encoding values 302, and sub-stream 1 contains a representation of the metadata in one embodiment. Thus, referring to FIG. 8, the de-multiplexer 112 may receive a first substream 902 for the metadata and separate substreams 902 for each element/attribute name that has at least one associated value, i.e., <desc>, <color>, <size> and <quan>.

Once the de-multiplexer 112 has determined the metadata structure which specifies how the substreams 902 were split by the multiplexer 106, de-multiplexer 112 may use the metadata as a recipe to reassemble the substreams 906 into combined stream 908. The stream 908 may be created and implemented as any number of data structures, including buffers, streams, arrays, queues, and stacks, but may be implemented in any manner known in the art. In reading the substreams 906 and placing portions of the substreams in the proper order, de-multiplexer 112 may look for a value indicator which multiplexer 106 may have written to the structure stream indicating that an element or attribute value occurred at that position in the stream (indicated in FIG. 8 by the symbol "/").

FIG. 10 illustrates in more detail selected aspects of a decoder of the invention, in accordance with various embodiments. Decoder 114 may be implemented as one or more processes, such as data determination and generation process 1008, capable of receiving the stream of encoding values 1002, receiving or deriving knowledge of the data 1004 corresponding to the data represented by encoding values 1002, which may include one or more finite automata 1006, determining the data 1010 corresponding to the encoding values 1002, based at least in part on the knowledge representation, and generating the determined data 1010. The processes of the decoder 114 may all be implemented on one computer system or on several, as a distributed process or processes on several computer systems of a network.

In various embodiments, decoder 114 may receive the encoding values 1002 from de-multiplexer 112, which may be on the same or a different computer system. The encoding values 1002 received by decoder 114 may comprise unique sequences of zero, one, or more bits correspondingly representing data, and in some embodiments comprise a sequence of bytes. As described above, the sequence of bits chosen to represent various types and structures of data, such as XML elements, may be determined at least in part based on the knowledge representation of the data, such as one or more finite automata 1006. Also, encoding values 1002 may further comprise values representing knowledge of the data 1004, algorithms used to encode the data, and/or parameters used in encoding the data (the latter two, though part of the data received by the decoder 114, may or may not be encoded).

As illustrated, knowledge of the data 1004 may be any sort of structure or grammar describing the content and relationships of data known in the art. Knowledge of the data 1004 may include regular expressions, database schemas, schema languages, programming languages, and/or IDLs. Specific examples include the XML Schema Language (as shown in the schema fragments of FIGS. 5a, 5c, and 6a), the RelaxNG schema language, the XML DTD language, BNF, extended BNF, Java, C, C++, C#, and CORBA. A more detailed description of knowledge of the data 1004 as conveyed by XML schemas may be found above in the description of FIGS. 5a, 5c, and 6a.

Referring to FIG. 10 again, decoder 114 may obtain knowledge of the data 1004 in a plurality of ways. In some embodiments, knowledge of the data 1004 may be pre-provided to decoder 114 by a user of the computer system or systems executing the decoder 114. The knowledge may be uploaded into computer system memory through a network interface or read from a storage medium. In such embodiments, no further analysis is needed and the knowledge of the data may simply be compiled into the knowledge representation, which may include one or more finite automata.

In other embodiments, when knowledge of the data 1004 is not pre-provided, decoder 114 or a related process may derive knowledge of the data 1004. In various embodiments, decoder 114 may make a first pass through of encoding values 1002. If encoding values 1002 include a plurality of values representing knowledge of the data 1004, decoder 114 may use the values to generate the corresponding knowledge of the data 1004. In other embodiments, decoder 114 may derive knowledge of the data 1004 concurrently with processing the encoding values 1002. In a number of embodiments, encoding values 1002 may represent data that deviates from knowledge of the data 1004. In such embodiments, decoder 114 may be adapted to represent these deviations from knowledge of the data 1004 as a part of the one or more finite automata 1006 representing knowledge of the data 1004, this process described in greater detail below.

In other embodiments, knowledge of the data 1004 is not received or derived by decoder 114, but is instead compiled on a separate system or by a separate process into representations of knowledge 1006, which may include one or more finite automata. Representations of knowledge 1006 may then be provided directly to decoder 114, obviating the need for decoder 114 to receive or derive knowledge of data 1004. In one embodiment, the representations of knowledge 1006 may be provided in XML format. In one embodiment, the representations of knowledge 1006 may be encoded by an encoder 104 of the current invention running on the same system or a separate system. As such, decoder 114 may be used to decode both encoding values 1002 and knowledge representation 1006.

In some embodiments, not all the knowledge 1004 possessed by the decoder 114 may be used. For example, if the computer system having decoder 114 has engaged in a knowledge negotiation with a sender computer system having an encoder 104 (as is discussed above in reference to FIG. 1), and the computer systems determine that the shared knowledge 108 is a subset of knowledge 1004, only the subset of knowledge 1004 may be compiled into knowledge representations and used to decode the encoding values 1002 (or, if pre-compiled on another system and provided, only the knowledge representations 1006 representing the subset of knowledge 1004 may be used).

As is further illustrated, once knowledge of the data 1004 is received or derived, decoder 114 or a related process (such as the knowledge representation compiling process described above) may represent knowledge of the data 1004 as one or more finite automata 1006. The finite automata may be deterministic or non-deterministic, and may, in some embodiments, comprise a nested structure. In various embodiments, the finite automata 1006 may comprise data structures or objects of a programming language (e.g., C++ objects) have a plurality of "nodes," each node specifying a node or nodes that may follow the current node. FIG. 5b illustrates an example including a first finite automaton with a second nested finite automaton. The first finite automaton accepts a <note> element. The second, nested finite automaton accepts the contents of the <note> element, which includes a <to > element followed by a <from> element followed by a <heading> element followed by a <body> element. Additional nested finite automaton (not shown) might also exist that accept the string contents of the <to > element, <from> element, among others. Each finite automaton may have one or more start states and one or more end states, each end state having no out going transitions to other nodes. Some finite automata may have one or more nodes that each has a plurality of out going transitions to possible next nodes. FIG. 5d illustrates another example including a first finite automaton, which has a second nested finite automaton, which has a third nested finite automaton. In that example, the first finite automaton includes a single transition that accepts the "<pet>" element. The second, nested finite automaton accepts the contents of the "<pet>" element, which may start with any one of "<ownerName>," "<petName>," and "<adopted>." The third finite automaton accepts the contents of the "<adopted>" element, which may start with "<is Adopted>" or "<is NotAdopted>."

As discussed above, in some embodiments, a transition or transitions of a finite automaton may contain references to other "nested" finite automata. For example, the transition "<note>" of the finite automata shown in FIG. 5b, representing the structure of an XML document, contains a reference to a second finite automata representing the contents of the <note> element. The nesting of finite automata is further illustrated and discussed in FIG. 7.

Referring to FIG. 10 again, in some embodiments, nodes of the finite automata 1006 may include an "anything here" or "wildcard" transition (further illustrated in FIG. 6c) that match any data not described by other outgoing transitions from that node to handle data represented by encoding values 1002 that deviates from the knowledge of the data 1004. In some embodiments, described below, where knowledge 1004 must be derived as the encoding values 1002 are decoded (effectively, where all the values 1002 are treated like "deviant data"), wildcard transitions may also be effectively used to successively build the knowledge 1004 and knowledge representations 1006.

As mentioned above, data represented by values 1002 may deviate from the structure or content described by knowledge of the data 1004, in some embodiments. As the decoder 114 processes values 1002 to determine the data 1010 represented by the lower entropy encoding values 1002, decoder 114 may encounter portions of data represented by values 1002 that are not described by knowledge of the data 1004. In one embodiment, such "deviant" data 1010 that are not described by knowledge of the data 1004 may match a wildcard transition in a finite automaton. In one embodiment, when data matches a wildcard transition, decoder 114 or a related process may augment finite automata 1006 by adding a new transition to match future instances of the deviant data directly without the use of the wildcard. Thus, the next time the same data 1010 represented by values 1002 is encountered, it will match the newly added transition instead of the wildcard transition allowing decoder 114 to decode "deviant" data more efficiently. This may be accomplished, in various embodiments, by adding an additional transition to the node from which the wildcard transition matching deviant data 1010 originated, the transition being in addition to the wildcard transition. In addition, decoder 114 or a related process may add a new nested finite automaton to represent the content of the deviant data. In one embodiment, the newly added nested finite automaton includes a start state with an outgoing wildcard transition pointing back to the start state.

FIGS. 6a-6c illustrate an example. In this example, the knowledge of the data in FIG. 6a is a schema fragment describing a "<note>" element containing a "<to >" element followed by a "<from>" element followed by a "<heading>" element followed by a "<body>" element. However, the XML data 1010 received in FIG. 6b has a "<date>" element following the "<heading>" element that is not described by the knowledge of data in FIG. 6a. Many of the nodes in FIG. 6c have outgoing wildcard transitions marked by * symbols in the figure. The deviant "<date>" element shown in FIG. 6b will first match the wildcard transition on the node pointed to by the "<heading>" transition causing the finite automaton to accept the deviant data. Accordingly, when the "<date>" element matches the wildcard transition decoder 114 or a related process may augment finite automata 1006 by adding a third possible transition to the node pointed to by the "<heading>" transition, which will match future instances of the "<date>" element directly without the use of the wildcard. Thus, the finite automaton illustrated in FIG. 6c illustrates the augmented finite automaton, in which the "<heading>" element may be followed by a "<date>" element, a "<body>" element or anything else that matches the wildcard transition. The first time the deviant data 1010 represented by values 1002 is encountered, it will match the "wildcard" transition. Decoder 114 may then decode encoding values 1002 representing the wildcard transition followed by encoding values describing the deviant data (e.g., the type, name and possibly other information about the deviant data).

As mentioned above, decoder 114 may not have any knowledge 1004 describing the data represented by the encoding values 1002. Rather, the decoder 114 may need to derive the knowledge 1004 simultaneously with decoding the encoding values 1002, in some embodiments. In such embodiments, decoder 114 may first create an empty finite automaton 1006, including one node with a wildcard transition. The first time a structural element of the data represented by values 1002 is encountered, it may match the wildcard transition. Decoder 114 may also enhance the finite automaton 1006 by representing the element as a possible transition, thereby augmenting the finite automata 1006 to represent more and more of the structure of the data represented by values 1002. Additionally, decoder 114 may create another finite automaton 1006, nested below the first and also comprising one node with one wildcard transition, to represent content and/or nested elements within the first structural element that may be subsequently encountered as the encoding values 1002 are processed. The transition representing the first encountered element may point to the new, nested automaton 1006. Should the decoder 114 then encounter the first element again while processing values 1002, the first element may now be decoded according to its represented transition, which may have allowed the data 1010 to be encoded in fewer bits by encoder 104. If an element or content nested within the first element is then encountered, a new transition may be added by decoder 114 to the nested automaton 1006. If an element was encountered, an additional automaton 1006 nested down an additional level (that is, an automaton 1006 nested from the nested automaton 1006) may be created by the decoder 114, also comprising a node and wild card transition, and also pointed to by the new element. In such an iterative fashion, the finite automata 1006 representing data represented by encoding values 1002 may be incrementally developed, requiring less and less enhancement over time as the same elements are encountered more and more frequently.

Referring to FIG. 10 again, decoder 114 or a related process may create one or more finite automata 1006 by compiling knowledge of the data 1004. For example, Xerces, the open source Apache™ XML Parser parses schemas and creates finite automata for the schemas to aid in validation. Such finite automata may be the finite automata utilized by decoder 114. In some embodiments, such as those where the knowledge 1004 is derived as the values 1002 are decoded, the representations 1006 may be compiled from the knowledge 1004 incrementally, as the knowledge is derived.

As shown, a data determination and generation process 1008 of decoder 114 may determine and generate data 1010 corresponding to lower entropy encoding values 1002, the determining based at least in part on the knowledge representation of data 1010, which may include one or more finite automata 1006. The finite automata 1006 may facilitate representation of a large number of structural elements of data 1010 in a small number of bit sequence values based on the location of the structural elements within a finite automaton 1006. In FIG. 5d "<pet>" may contain "<ownerName>," "<petName>," or "<adopted>." Given that one of the three elements must appear in the content of "<pet>," only three distinct encoding values are required to represent the three elements (e.g., 0, 1 and 2). In one embodiment, any of these three values may be represented by at most two bits. "<ownerName>" may be represented by "00", "<petName>" my be represented by "01", and "<adopted>" may be represented by "10" Another node, not shown, may be followed by four possible transitions, which may be represented by four distinct values (e.g., 0, 1, 2 and 3). In one embodiment, the first of these transitions may be represented by the value "00". The first of these transitions does not need to have any correspondence or relation to "<ownerName>," but both may nonetheless be represented by the same value (i.e., "00"). Thus, decoder 114 may use knowledge representation 1006 to map a sequence of lower entropy identical or overlapping values 1002 to a sequence of unrelated higher entropy data 1010. In some embodiments, an encoding value 1002 for a corresponding data item may be received as a byte comprising the bits encoding the data and other non-significant bits, for example, zeros added to the beginning or the end of the encoding bits. The encoding values may have been encoded by encoder 104 as bytes to facilitate compression. The data determination and generation process 1008, upon encountering the byte-sized encoding value, may ignore the non-significant added bits and only utilize the encoding bits in generating the data 1010. The non-significant parts may be determined by reference to the knowledge representation 1006, which may allow process 1008 to determine how many bits would have been used to encode the data item 1010. Further, if a given node is followed by only a single out-going transition, the data represented by the transition may be represented by zero bits in the encoding values 1002, or—in other words—represented by no encoding value.

In various embodiments, in addition to decoding elements in the above described manner, the decoder 114 may decode string values of the elements (e.g., an element <name> may have a string value of "John Smith") the using string tables. A string table may comprise an indexed list of strings, each string having a unique index, and the table itself having an index. For example, if the strings comprising data represented by encoding values 1002 are "foo," "bar," and "fuz," decoder 114 may create a string table with an entry for each string. Since there are three strings, only two bits are needed to create a unique index for each string. Thus, "foo" may have an index of "00", "bar" may have an index of "01", and "fuz" may have an index of "10".

Decoder 114 may create the tables incrementally, as strings are encountered while decoding the values 1002, creating an entry and index for each string. The first time a string is encountered by decoder 114 it may simply be represented in encoding values 1002 as a series of characters preceded by a length field. The decoder 114 may then add an entry for the string to the string table. The next time the string is encountered, it may be represented by encoding values 1002 as by a "0" (using the "0" length as an index for the table) and by the index of the string in the table. The decoder noting such a bit sequence may simply use the bit sequence to look up the actual string value, recovering the data 1010.

In one embodiment, rather than having one table including all strings, decoder 114 may generate a plurality of tables of strings. For example, if the data represented by encoding values 1002 includes the elements <name> and <race>, decoder 114 could create one string table for <name> values and another string table for <race> values. In yet another embodiment, decoder 114 may create both a plurality of tables divided by, for example, element type, as well as a larger string table comprising all strings in the data represented by encoding values 1002.

Data determination and generation process 1008 may, in some embodiments, determine the data represented by the above bit sequences, which may be the encoding values 1002, by traversing the finite automata 1006 as it processes values 1002. For example, if finite automata 1006 have been created prior to processing values 1002, process 1008 may traverse the automata 1006 concurrently with reading values 1002, and upon finding values 1002 representing data 1010 correspond to a given transition in the finite automata 1006, may represent the values 1002 as the data element 1010 corresponding to the transition.

In some embodiments, encoding values 1002 may have a different ordering than corresponding portions of data 1010. For example, all encoding values 1002 for portions of data 1010 that are of type string may be represented together, and all encoding values 1002 of portions of data 1010 that are of type integer may be represented together and follow the strings. In another example, encoding values 1002 for portions of data 1010 may be grouped by element/attribute name instead, and represented together in such groups.

Upon determining the represented data 1010, decoder 114 may generate the data 1010. Data 1010 may be any sequence of zero, one, or more bits, and may or may not have a structure. In various embodiments, data 1010 is structured as XML data, character data, data from a database, structures defined by a programming language, and/or structures defined by an IDL. Further, data items specified by the structure of data 1010 and contained within data 1010 may be provided by decoder 114 as one or more of the data types integer, long, short, byte, string, date, Boolean, float, double, qualified name, byte array, and/or typed list. In some embodiments, knowledge of the received data 1004 (discussed more above) may facilitate automatic conversion of typed data items of encoding values 1002 to one or more requested types (e.g., types requested by an application via an API) from another data type or types determined by the knowledge of the data 1004.

Further, one or more application or system processes may directly access the data 1010 from decoder 114, or may access the data 1010 from the decoder 114 via an API, discussed above.

FIG. 11 illustrates a flow chart view of selected operations needed to combine a received plurality of substreams of encoding values, and to determine data corresponding to encoding values, facilitated by one or more finite automata, in accordance with various embodiments. As illustrated, in some embodiments, not all the knowledge of the data possessed by the decoder 114 may be used be used to decode the data. Prior to receiving the plurality of substreams of encoding values to combine and decode, the computer system having de-multiplexer 112 and decoder 114 may engage in a content/knowledge negotiation with a sender computer system having an encoder 104 and multiplexer 106 (as is discussed above in reference to FIG. 1), block 1102, and the computer systems may determine that the shared knowledge 108 is a subset of knowledge of the data possessed by the receiving system. In such embodiments, only a subset of the knowledge of the data may be compiled into knowledge representations and used to decode the data represented by the received encoding values.

In some embodiments, after the computer system having de-multiplexer 112 has engaged in content negotiation with a sender computer system, the de-multiplexer 112 may receive a plurality of substreams of bytes of encoding values from another computer system having encoder 104 and/or multiplexer 106 via a networking fabric or storage medium, block 1104, in the manner described above in reference to FIG. 1. The plurality of substreams 902 may comprise a plurality of smaller and/or lower entropy encoding values as bytes representing larger and/or higher entropy data, such as XML.

In various embodiments, de-multiplexer 112 or another process may next de-compress each of the plurality of substreams, block 1106. The de-compression process may be facilitated by any compression algorithm known in the art, such as Huffman, Lempel-Ziv, or Deflate. These algorithms are well known to those skilled in the art, however, and the details of their implementations need not be described further. In one embodiment, de-multiplexer 112 or another process may determine that one or more substreams have not been compressed. The determination whether a substream has not been compressed may be made based on metadata. The metadata may be derived from a number of sources and may include identifiers associated with substreams, sizes associated with substreams (e.g., in bytes), data types associated with data from substreams, names associated with data from the substream, and analysis results associated with the data of the substream, such as statistical averages of values in a substream, entropies of substreams, ranges of values in substreams, and frequency distributions of values in substreams.

As is shown, upon de-compressing the substreams, one or more of the plurality of substreams may be determined to be an aggregated/recombined substream and may be split into split substreams based on the one or more criteria used by multiplexer 106 to split the substreams (described above by FIG. 3). To determine which substreams are aggregated substreams, de-multiplexer 112 may first determine whether a substream includes a field indicating that the substream is an aggregated substream. The field may be or may not be encoded. If encoded, the field may be sent to the decoder 112 for decoding. The field may also include indicia of how many substreams comprise the aggregated substream, and which portions belong to which substream. In other embodiments, if no field is included, de-multiplexer 112 may determine the one or more criteria used to split the original stream into a plurality of substreams, and may apply the criteria to all of the substreams, or only those substreams including a field indicating that the substream is an aggregated substream. By applying the one or more criteria used by the multiplexer 106 to split the original stream of encoding values, de-multiplexer 112 may be able to arrive at the post-split, pre-recombination substreams of the sender.

Further, the implementation of the substream splitting process may involve the creation of a new buffer, stream, array, stack, or queue. De-multiplexer 112 may initialize such a data structure, which may have the same type as the data structures comprising substreams, and in splitting aggregated substreams may place one split substream into the newly initialized structure, and may remove that portion from the aggregated substream, such that the aggregated substream may become another split substream, block 1108.

As is further illustrated, a combined stream of encoding values resulting from combining the substreams may be determined by de-multiplexer 112 in any of a number of ways. Multiplexer 106 may have determined a plurality of substreams of bytes of encoding values, randomly, placing portions of a stream of encoding values at random into any number of substreams, the substreams acting as "buckets" for the byte-sized portions of the stream allocated into them. By applying the same randomization algorithm to substreams in reverse, de-multiplexer 112 may reproduce the original stream of encoding values as a combined stream of encoding values.

In other embodiments, a combined stream of encoding values may be determined by de-multiplexer 112 based on one or more pre-determined criteria, which may be the same criteria used by multiplexer 106 to split the original stream of encoding values. The one or more criteria may comprise metadata describing the content and/or structure of data represented by plurality of substreams, and the metadata may have any number of sources. The metadata may have been originally derived from the data itself and/or one or more descriptions of the data by encoder 104 or may have already been known to the computer system having multiplexer 106. The multiplexer 106 may then have created a substream comprised of the metadata, as is shown in FIG. 8, and may have provided this substream to the de-multiplexer 112 first as a "control stream," which may inform the de-multiplexer 112 of the metadata. The metadata may have been derived from one or more of names associated with data items, types associated with data items, and/or the content of data items. Metadata serving as the one or more criteria may have been determined/derived by the encoder 104, may be passed to multiplexer 106 with the stream of encoding values, and then subsequently passed to de-multiplexer 112 as a substream of encoding values representing the metadata.

As mentioned, one substream (e.g., the first substream) may represent the metadata, such that de-multiplexer 112 may read the specified substream to retrieve said metadata and determine the criteria needed to combine the remaining substreams. For example, FIG. 8 illustrates exemplary data of an XML document represented by a stream of encoding values, wherein the XML element names provide metadata defining the sequence and structure of data items in stream of encoding values, and sub-stream 1 contains a representation of the metadata in one embodiment. Thus, referring to FIG. 8, the de-multiplexer 112 may receive a first substream for the metadata and separate substreams for each element/attribute name that has at least one associated value, i.e., <desc>, <color>, <size> and <quan>.

Once the de-multiplexer 112 has determined the metadata structure which specifies how the substreams were split by the multiplexer 106, de-multiplexer 112 may use the metadata as a recipe to combine the substreams into a combined stream of encoding values, block 1110. The stream may be created and implemented as any number of data structures, including buffers, streams, arrays, queues, and stacks, but may be implemented in any manner known in the art. In reading the substreams and placing portions of the substreams in the proper order, de-multiplexer 112 may look for a value indicator which multiplexer 106 may have written to the structure stream indicating that an element or attribute value occurred at that position in the stream (indicated in FIG. 8 by the symbol "/").

As illustrated, decoder 114 may receive the combined stream of encoding values from de-multiplexer 112, which may be on the same or a different computer system. Upon receiving the stream, the decoder 114 may obtain the knowledge of the data by receiving the knowledge, block 1112, deriving the knowledge, block 1114, or some combination of both operations. The knowledge of the data may be pre-provided to/received by decoder 114 by a user of the computer system, systems executing the decoder 114, or other systems, or by the encoder 104 via a network or other media. The knowledge may be uploaded into computer system memory through a network interface or read from a storage medium. In such embodiments, no further analysis is needed and the knowledge of the data may simply be compiled into the knowledge representation, which may include one or more finite automata.

In other embodiments, when the knowledge of the data is not pre-provided or fully provided, decoder 114 or a related process may derive the knowledge of the data, block 1114. Decoder 114 may make a first pass through of the encoding values. If the encoding values include a plurality of values representing the knowledge of the data, decoder 114 may use the values to generate the corresponding knowledge of the data. In other embodiments, decoder 114 may derive the knowledge of the data concurrently with processing the encoding values. In a number of embodiments, the encoding values may represent data that deviates from the knowledge of the data. In such embodiments, decoder 114 may be adapted to represent these deviations from the knowledge of the data as a part of the one or more finite automata representing the knowledge of the data.

In other embodiments, knowledge of the data is not received or derived by the decoder 114, but is instead compiled on a separate system or by a separate process into representations of knowledge, which may include one or more finite automata. Representations of knowledge may then be provided directly to the decoder 114, block 1116, obviating the need for the decoder 114 to receive or derive knowledge of data. In one embodiment, the representations of knowledge of the data may be provided in XML format. In one embodiment, the representations of the knowledge of the data may be encoded by an encoder 104 of the current invention running on the same system or a separate system. As such, decoder 114 may be used to decode both the encoding values and the knowledge representations.

As is further illustrated, once the knowledge of the data has been received or derived, decoder 114 or a related process (such as the knowledge representation compiling process described above) may represent at least a portion of the knowledge of the data as one or more finite automata, block 1118. The finite automata may be deterministic or non-deterministic, and may, in some embodiments, comprise a nested structure. In various embodiments, the finite automata may comprise data structures or objects of a programming language (e.g., C++ objects) have a plurality of "nodes," each node specifying a node or nodes that may follow the current node. FIG. 5b illustrates an example including a first finite automaton with a second nested finite automaton. The first finite automaton accepts a <note> element. The second, nested finite automaton accepts the contents of the <note> element, which includes a <to > element followed by a <from> element followed by a <heading> element followed by a <body> element. Additional nested finite automaton (not shown) might also exist that accept the string contents of the <to > element, <from> element, among others. Each finite automaton may have one or more start states and one or more end states, each end state having no out going transitions to other nodes. Some finite automata may have one or more nodes that each has a plurality of out going transitions to possible next nodes. FIG. 5d illustrates another example including a first finite automaton, which has a second nested finite automaton, which has a third nested finite automaton. In that example, the first finite automaton includes a single transition that accepts the "<pet>" element. The second, nested finite automaton accepts the contents of the "<pet>" element, which may start with any one of "<ownerName>," "<petName>," and "<adopted>." The third finite automaton accepts the contents of the "<adopted>" element, which may start with "<is Adopted>" or "<is NotAdopted>."

As discussed above, in some embodiments, a transition or transitions of a finite automaton may contain references to other "nested" finite automata. For example, the transition "<note>" of a first finite automata shown in FIG. 5b, representing the structure of an XML document, contains a reference to a second finite automata representing the contents of the <note> element.

Further, in some embodiments, nodes of the finite automata may include an "anything here" or "wildcard" transition that match any data not described by other outgoing transitions from that node to handle data represented by the encoding values that deviates from the knowledge of the data. In some embodiments, described below, where the knowledge of the data must be derived as the encoding values are decoded, wildcard transitions may also be effectively used to successively build the knowledge of the data and the knowledge representations.

As mentioned above, data represented by the values may deviate from the structure or content described by the knowledge of the data, in some embodiments. As the decoder 114 processes the values to determine the data represented by the lower entropy encoding values, decoder 114 may encounter portions of data represented by the values that are not described by the knowledge of the data. In one embodiment, such "deviant" data that are not described by the knowledge of the data may match a wildcard transition in a finite automaton. In one embodiment, when data matches a wildcard transition, decoder 114 or a related process may augment the finite automata by adding a new transition to match future instances of the deviant data directly without the use of the wildcard. Thus, the next time the same data represented by the values is encountered, it will match the newly added transition instead of the wildcard transition allowing decoder 114 to decode "deviant" data more efficiently. This may be accomplished, in various embodiments, by adding an additional transition to the node from which the wildcard transition matching the deviant data originated, the transition being in addition to the wildcard transition. In addition, decoder 114 or a related process may add a new nested finite automaton to represent the content of the deviant data. In one embodiment, the newly added nested finite automaton includes a start state with an outgoing wildcard transition pointing back to the start state.

As mentioned above, decoder 114 may not have any knowledge of the data describing the data represented by the encoding values. Rather, the decoder 114 may need to derive the knowledge of the data simultaneously with decoding the encoding values, in some embodiments. In such embodiments, decoder 114 may first create an empty finite automaton, including one node with a wildcard transition. The first time a structural element of the data represented by the encoding values is encountered, it may match the wildcard transition. Decoder 114 may also enhance the finite automaton by representing the element as a possible transition, thereby augmenting the finite automata to represent more and more of the structure of the data represented by the encoding values. Additionally, decoder 114 may create another finite automaton, nested below the first and also comprising one node with one wildcard transition, to represent content and/or nested elements within the first structural element that may be subsequently encountered as the encoding values are processed. The transition representing the first encountered element may point to the new, nested automaton. Should the decoder 114 then encounter the first element again while processing the encoding values, the first element may now be decoded according to its represented transition, which may have allowed the data to be encoded in fewer bits by encoder 104. If an element or content nested within the first element is then encountered, a new transition may be added by decoder 114 to the nested automaton. If an element was encountered, an additional automaton nested down an additional level (that is, an automaton nested from the nested automaton) may be created by the decoder 114, also comprising a node and wild card transition, and also pointed to by the new element. In such an iterative fashion, the finite automata representing data represented by the encoding values may be incrementally developed, requiring less and less enhancement over time as the same elements are encountered more and more frequently.

Decoder 114 or a related process may create the one or more finite automata by compiling the knowledge of the data. For example, Xerces, the open source Apache™ XML Parser parses schemas and creates finite automata for the schemas to aid in validation. Such finite automata may be the finite automata utilized by decoder 114. In some embodiments, such as those where the knowledge of the data is derived as the encoding values are decoded, the knowledge representations may be compiled from the knowledge of the data incrementally, as the knowledge is derived.

As shown, decoder 114 may then determine the data represented by the values, block 1120, and generate the determined data, block 1122. The determining may be based at least in part on the knowledge representation of the data, which may include one or more finite automata. The finite automata may facilitate representation of a large number of structural elements of the data in a small number of bit sequence values based on the location of the structural elements within a finite automaton. In FIG. 5d "<pet>" may contain "<ownerName>," "<petName>," or "<adopted>." Given that one of the three elements must appear in the content of "<pet>," only three distinct encoding values are required to represent the three elements (e.g., 0, 1 and 2). In one embodiment, any of these three values may be represented by at most two bits. "<ownerName>" may be represented by "00", "<petName>" my be represented by "01", and "<adopted>" may be represented by "10." Another node, not shown, may be followed by four possible transitions, which may be represented by four distinct values (e.g., 0, 1, 2 and 3). In one embodiment, the first of these transitions may be represented by the value 0. The first of these transitions does not need to have any correspondence or relation to "<ownerName>," but both may nonetheless be represented by the same value (i.e., 0). Thus, decoder 114 may use knowledge representation to map a sequence of lower entropy identical or overlapping values to a sequence of unrelated higher entropy data. In some embodiments, an encoding value for a corresponding data item may be received as a byte comprising the bits encoding the data and other non-significant bits, for example, zeros added to the beginning or the end of the encoding bits. The encoding values may have been encoded by encoder 104 as bytes to facilitate compression. The data determination and generation process of the decoder 114, upon encountering the byte-sized encoding value, may ignore the non-significant added bits and only utilize the encoding bits in generating the data. The non-significant parts may be determined by reference to the knowledge representation, which may allow the decoder 114 to determine how many bits would have been used to encode the data item. If a given node is followed by only a single out-going transition, the data represented by the transition may be represented by zero bits in the encoding values, or—in other words—represented by no encoding value.

In various embodiments, in addition to decoding elements in the above described manner, the decoder 114 may decode string values of the elements (e.g., an element <name> may have a string value of "John Smith") the using string tables, determining and generating the encoded data, blocks 1120-1122. A string table may comprise an indexed list of strings, each string having a unique index, and the table itself having an index. For example, if the strings comprising data represented by the encoding values are "foo," "bar," and "fuz," decoder 114 may create a string table with an entry for each string. Since there are three strings, only two bits are needed to create a unique index for each string. Thus, "foo" may have an index of "00", "bar" may have an index of "01", and "fuz" may have an index of "10".

Decoder 114 may create the tables incrementally, as strings are encountered, while decoding the encoding values, creating an entry and index for each string. The first time a string is encountered by decoder 114, it may simply be represented in the encoding values as a series of characters preceded by a length field. The decoder 114 may then add an entry for the string to the string table. The next time the string is encountered, it may be represented by encoding values 1002 as by a "0" (using the "0" length as an index for the table) and by the index of the string in the table. The decoder noting such a bit sequence may simply use the bit sequence to look up the actual string value, recovering the data.

In one embodiment, rather than having one table including all strings, decoder 114 may generate a plurality of tables of strings. For example, if the data represented by the encoding values includes the elements <name> and <race>, decoder 114 could create one string table for <name> values and another string table for <race> values. In yet another embodiment, decoder 114 may create both a plurality of tables divided by, for example, element type, as well as a larger string table comprising all strings in the data represented by the encoding values.

Decoder 114 may, in some embodiments, determine the data represented by the above bit sequences, block 1120, by traversing the finite automata as it processes the values. For example, if the finite automata have been created prior to processing the values, decoder 114 may traverse the automata concurrently with reading the values, and upon finding that the values representing the data correspond to a given transition in the finite automata, may represent the values as the data element corresponding to the transition.

Referring to FIG. 8 again, upon determining the represented data, decoder 114 may generate the data, block 1122. The data may be any sequence of zero, one, or more bits, and may or may not have a structure. In various embodiments, the data is structured as XML data, character data, data from a database, structures defined by a programming language, and/or structures defined by an IDL. Further, data items specified by the structure of the data and contained within the data may be provided by decoder 114 as one or more of the data types integer, long, short, byte, string, date, Boolean, float, double, qualified name, byte array, and/or typed list. In some embodiments, the knowledge of the data (discussed more above) may facilitate automatic conversion of typed data items of the data to requested types from another data type or types determined by the knowledge of the data.

Further, one or more application or system processes may directly access the decoded data from decoder 114, or may access the data from the decoder 114 via an API, discussed above.

Figure 12:
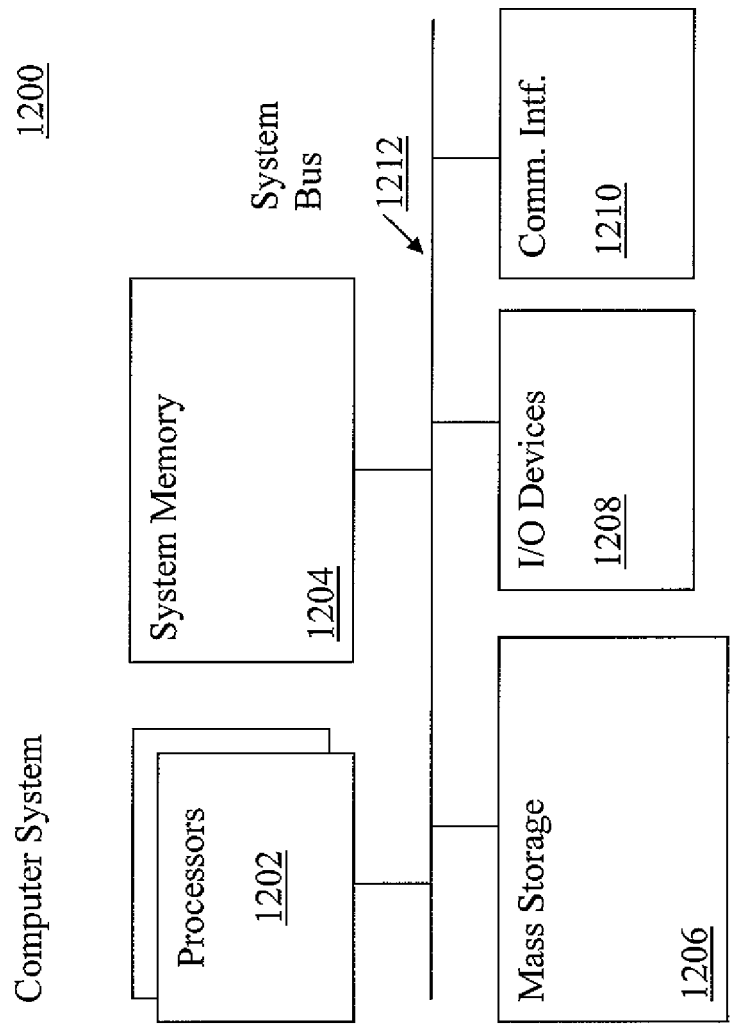
FIG. 12 illustrates an example computer system suitable for use to practice the encoder/multiplexer and/or decoder/de-multiplexer aspects of the present invention, in accordance with various embodiments.

FIG. 12 illustrates an example computer system suitable for use to practice the encoder/multiplexer and/or decoder/de-multiplexer aspects of the present invention, in accordance with various embodiments. As shown, computer system 1200 includes one or more processors 1202 and system memory 1204. Additionally, computer system 1200 includes input/output devices 1208 (such as keyboard, cursor control, and so forth). The elements are coupled to each other via system bus 1212, which represents one or more buses. In the case of multiple buses, they are bridged by one or more bus bridges (not shown). Each of these elements performs its conventional functions known in the art. In particular, system memory 1204 and mass storage 1206 are employed to store programming modules adapted to perform the encoder and multiplexer aspects and/or the decoder and de-multiplexer aspects of the present invention, and a permanent copy of the programming instructions implementing the programming modules adapted to perform the encoder and multiplexer aspects and/or the decoder and de-multiplexer aspects of the present invention, respectively. The permanent copy of the instructions implementing the programming modules adapted to perform the encoder and multiplexer aspects and/or the decoder and de-multiplexer aspects of the present invention may be loaded into mass storage 1206 in the factory, or in the field, through a distribution medium (such as an article of manufacture with storage medium, not shown) or through communication interface 1210 (e.g., from a distribution server). The constitution of these elements 1202-1212 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the present invention. This application is intended to cover any adaptations or variations of the embodiments discussed herein. Therefore, it is manifestly intended that this invention be limited only by the claims and the equivalents thereof.

What is claimed is:

1. A method comprising:
receiving, by a computing device, data;
generating, by the computing device, a stream of encoding values encoding the data, based at least in part on one or more knowledge representations of the data, the knowledge representations representing one or more of:
a structure of the data,
data types of the data,
a likelihood of occurrence of one or more data items,
one or more ignorable data items,
one or more re-orderable data items,
one or more parameters used to control encoding or decoding data,
one or more identifiers for algorithms used to encode data, and
one or more associations between data types and encoding algorithms; and
splitting, by the computing device, the stream of encoding values into a plurality of substreams based on one or more criteria to improve overall compression effectiveness during subsequent compressing of encoding values of one or more of the plurality of substreams.

2. The method of claim 1, wherein the knowledge representations of the data comprise one or more finite automata, deterministic or non-deterministic, with zero or more containing references to one or more nested finite automata.

3. The method of claim 1, further comprising receiving or deriving, by the computing device, at least a portion of the knowledge representations of the data, from one or more selected from the group consisting of a database schema, a grammar, a regular expression, a schema language, a programming language, and an interface definition language.

4. The method of claim 1, further comprising deriving, by the computing device, at least a portion of the knowledge representations by analyzing the received data.

5. The method of claim 1, wherein the received data is a portion extracted from a larger set of data, and the knowledge representations comprise at least one finite automaton having at least one node and at least one edge for at least one element of the received data, wherein the at least one edge of the at least one element points to one or more additional nested finite automata.

6. The method of claim 1, wherein said generating comprises:
determining whether a data item of the data is specified in a table of at least one of values, element names, and attribute names of the data, and
if the data item is specified by the table, generating an encoding value for the data item comprised of an index of the data item within the table, or
if the data item is not specified by the table, adding an entry for the data item in the table.

7. The method of claim 1, wherein said generating comprises determining, based at least in part on the knowledge representations of the data, at least one of:
which data items are likely to occur at one or more positions in the data,
a unique sequence of values to represent one or more data items in a sequence of data items extracted from the data,
a distinct sequence of bits to represent said unique sequence of values,
one or more data items that can be omitted, without having encoding values generated for them,
one or more data items that can be implicitly encoded using zero bits,
one or more algorithms to be invoked to generate one or more of the encoding values, and
one or more data items of the data for which corresponding encoding values are reorderable.

8. The method of claim 1, further comprising selectively recombining, by the computing device, two or more of the plurality of substreams based on one or more additional criteria to further improve overall effectiveness in compressing the encoding values.

9. The method of claim 8, further comprising separately compressing, by the computing device, some or all of the recombined and not recombined substreams, wherein the compressing is facilitated by a compression algorithm, and the compression algorithm is one of a Huffman, a Lempel-Ziv, and a Deflate algorithm.

10. The method of claim 1, further comprising sending, by the computing device, the substreams of encoding values to a recipient device having a decoder capable of recovering the data from the encoding values.

11. The method of claim 10, further comprising, prior to said generating,
notifying, by the computing device, the recipient device of a content type of the received data, a encoding type of the encoding values to be generated, and a first one or more schemas represented by one or more of the knowledge representations, and
receiving, by the computing device, notification of content types, encoding types, and a second one or more schemas known to the recipient device.

12. A method comprising:
receiving, by a computing device, a plurality of substreams of compressed encoding values, wherein the encoding values encode data;
decompressing, by the computing device, the plurality of substreams to recover the encoding values of the substreams;
combining, by the computing device, the encoding values of the plurality of substreams into a stream of encoding values based on one or more criteria to facilitate decoding of the data; and
recovering, by the computing device, the data from the stream of encoding values, based at least in part on one or more knowledge representations of the data, representing one or more of:
a structure of the data,
data types of the data,
a likelihood of occurrence of one or more data items,
one or more ignorable data items,
one or more re-orderable data items,
one or more parameters used to control encoding or decoding data,
one or more identifiers for algorithms used to encode data, and
one or more associations between data types and encoding algorithms.

13. The method of claim 12, wherein the knowledge representations of the data comprise one or more finite automata, deterministic or non-deterministic, with zero or more containing references to one or more nested finite automata.

14. The method of claim 12, further comprising receiving or deriving, by the computing device, at least a portion of the knowledge representations of the data, from one or more selected from the group consisting of a database schema, a grammar, a regular expression, a schema language, a programming language, and an interface definition language.

15. The method of claim 12, further comprising deriving, by the computing device, at least a portion of the knowledge representations by analyzing the stream of encoding values representing the data.

16. The method of claim 12, wherein the combined stream of encoding values representing the data represents a portion extracted from a larger set of data, and the knowledge representations comprise at least one finite automaton having at least one node and at least one edge for at least one element of the combined stream of encoding values representing the data, wherein the at least one edge of the at least one element points to one or more additional nested finite automata.

17. The method of claim 12, wherein said recovering comprises:
   determining whether a data item represented by the stream of encoding values is specified in a table of at least one of values, element names, and attribute names of the data, the determining including determining if one or more encoding values of the stream of encoding values representing the data item represent an index of the data item within the table, and
   if the data item is specified by the table, recovering the data item, or
   if the data item is not specified by the table, adding an entry for the data item in the table.

18. The method of claim 12, wherein said recovering comprises determining, based at least in part on the knowledge representations of the data, at least one of:
   which data items are likely to occur at one or more positions in the data,
   a unique sequence of values to represent one or more data items in a sequence of data items extracted from the data,
   a distinct sequence of bits to represent said unique sequence of values,
   one or more data items that can be omitted, without having encoding values generated for them,
   one or more data items that can be implicitly encoded using zero bits,
   one or more algorithms to be invoked to generate one or more of the encoding values, and
   one or more data items of the data for which corresponding encoding values are reorderable.

19. The method of claim 12, wherein the decompressing is facilitated by a compression algorithm, and the compression algorithm is one of a Huffman, a Lempel-Ziv, and a Deflate algorithm.

20. The method of claim 12, further comprising receiving, by the computing device, the substreams of encoding values from a sender device having an encoder capable of generating the encoding values from the data.

21. The method of claim 20, further comprising, prior to said receiving the substreams and said generating the encoding values by the sender device,
   receiving, by the computing device, notification from the sender device of a content type of the received data, a encoding type of the encoding values to be generated, and a first one or more schemas represented by one or more of the knowledge representations, and
   notifying, by the computing device, the sender device of known content types, known encoding types, and a second one or more known schemas.

22. An apparatus comprising:
   a receiver adapted to receive data; and
   an encoder coupled to the receiver and adapted to generate a stream of encoding values to encode the data, based at least in part on one or more knowledge representations of the data, the knowledge representations representing one or more of:
   a structure of the data,
   data types of the data,
   a likelihood of occurrence of one or more data items,
   one or more ignorable data items,
   one or more re-orderable data items,
   one or more parameters used to control encoding or decoding data,
   one or more identifiers for algorithms used to encode data, and
   one or more associations between data types and encoding algorithms; and
   a multiplexer coupled to the encoder and adapted to split the stream of encoding values into a plurality of sub streams based on one or more criteria to improve overall compression effectiveness during subsequent compressing of encoding values of one or more of the plurality of sub streams.

23. The apparatus of claim 22, wherein said encoder is adapted to determine, based at least in part on the knowledge representations of the data, at least one of
   which data items are likely to occur at one or more positions in the data,
   a unique sequence of values to represent one or more data items in a sequence of data items extracted from the data,
   a distinct sequence of bits to represent said unique sequence of values,
   one or more data items that can be omitted, without having encoding values generated for them,
   one or more data items that can be implicitly encoded using zero bit,
   one or more algorithms to be invoked to generate one or more of the encoding values, and
   one or more data items of the data for which corresponding encoding values are reorderable.

24. An apparatus comprising:
   a receiver adapted to receive a plurality of substreams of compressed encoding values, wherein the encoding values encode data;
   a de-multiplexer coupled to the receiver, and adapted to:
   decompress the plurality of substreams to recover the encoding values of the substreams; and
   combine the encoding values of the plurality of substreams into a stream of encoding values based on one or more criteria to facilitate decoding of the data; and
   a decoder coupled to the de-multiplexer and adapted to recover the data from the stream of encoding values, based at least in part on one or more knowledge representations of the data, representing one or more of:
   a structure of the data,
   data types of the data,
   a likelihood of occurrence of one or more data items,
   one or more ignorable data items,
   one or more re-orderable data items,
   one or more parameters used to control encoding or decoding data,
   one or more identifiers for algorithms used to encode data, and
   one or more associations between data types and encoding algorithms.

25. The apparatus of claim 24, wherein said decoder is further adapted to determine, based at least in part on the knowledge representations of the data, at least one of:

one or more data items are likely to occur at one or more positions in the data, one or more data items corresponding to a unique sequence of representation values, one or more unique sequence of values corresponding to a distinct sequence of representation bits, one or more omitted data items without having received encoding values, one or more data items implicitly encoded using zero bit, one or more algorithms to be invoked to decode one or more of the encoding values, and one or more data items which encoding values are reordered.

* * * * *